(12) United States Patent
Mori et al.

(10) Patent No.: US 9,818,511 B2
(45) Date of Patent: Nov. 14, 2017

(54) ELECTRONIC COMPONENT AND METHOD FOR MANUFACTURING THE SAME

(71) Applicant: Murata Manufacturing Co., Ltd., Nagaokakyo-shi, Kyoto-fu (JP)

(72) Inventors: Haruhiko Mori, Nagaokakyo (JP); Hiroyuki Otsuna, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 543 days.

(21) Appl. No.: 14/487,122

(22) Filed: Sep. 16, 2014

(65) Prior Publication Data
US 2015/0084487 A1 Mar. 26, 2015

(30) Foreign Application Priority Data
Sep. 25, 2013 (JP) .................................. 2013-198167

(51) Int. Cl.
*H01L 41/04* (2006.01)
*H01C 7/00* (2006.01)
(Continued)

(52) U.S. Cl.
CPC ......... *H01C 7/008* (2013.01); *H01F 17/0013* (2013.01); *H01F 27/292* (2013.01);
(Continued)

(58) Field of Classification Search
CPC combination set(s) only.
See application file for complete search history.

(56) References Cited

U.S. PATENT DOCUMENTS

| 2008/0081200 A1 | 4/2008 | Katsube et al. |
| 2015/0043125 A1 | 2/2015 | Park et al. |
| 2015/0054388 A1* | 2/2015 | Itagaki ................... H01C 7/008 310/364 |

FOREIGN PATENT DOCUMENTS

| CN | 101189693 A | 5/2008 |
| JP | 6-177525 A | 6/1994 |

(Continued)

OTHER PUBLICATIONS

Official Communication issued in corresponding Japanese Patent Application No. 2013-198167, dated Aug. 4, 2015.

*Primary Examiner* — Thomas Dougherty
*Assistant Examiner* — Karen B Addison
(74) *Attorney, Agent, or Firm* — Keating & Bennett, LLP

(57) ABSTRACT

In an electronic component, an outer electrode includes a sintered layer including a sintered metal, a reinforcement layer not containing Sn but including Cu or Ni, an insulation layer, and a Sn-containing layer. The sintered layer extends from each end surface of an element assembly onto at least one main surface thereof to cover each end surface of the element assembly. The reinforcement layer extends on the sintered layer and covers the sintered layer entirely. The insulation layer is directly provided on the reinforcement layer at each end surface of the element assembly, extends in a direction perpendicular or substantially perpendicular to a side surface of the element assembly, and defines a portion of a surface of the outer electrode. The Sn-containing layer covers the reinforcement layer except for a portion of the reinforcement layer that is covered by the insulation layer, and defines another portion of the surface of the outer electrode.

8 Claims, 11 Drawing Sheets

(51) Int. Cl.
*H01L 41/047* (2006.01)
*H01G 4/232* (2006.01)
*H01F 17/00* (2006.01)
*H01F 27/29* (2006.01)

(52) U.S. Cl.
CPC ......... *H01G 4/232* (2013.01); *H01L 41/0472* (2013.01); *H01L 41/0477* (2013.01); *Y10T 29/42* (2015.01); *Y10T 29/49206* (2015.01)

(56) References Cited

FOREIGN PATENT DOCUMENTS

| | | |
|---|---|---|
| JP | 2000-243647 A | 9/2000 |
| JP | 2000-286142 A | 10/2000 |
| JP | 2003-022929 A | 1/2003 |
| JP | 2006-339536 A | 12/2006 |
| JP | 2007-281134 A | 10/2007 |
| JP | 2015-37187 A | 2/2015 |

* cited by examiner

ELECTRONIC COMPONENT AND METHOD FOR MANUFACTURING THE SAME

BACKGROUND OF THE INVENTION

1. Field of the Invention

The present invention relates to electronic components and methods for manufacturing the electronic components, specifically to electronic components mounted by soldering and methods for manufacturing the electronic components.

2. Description of the Related Art

Japanese Unexamined Patent Application Publication No. 2003-22929 describes a multilayer ceramic capacitor in which an occurrence of a short circuit of inner electrodes due to a crack generated by thermal contraction of a solder fillet is suppressed.

In the multilayer ceramic capacitor disclosed in Japanese Unexamined Patent Application Publication No. 2003-22929, in the case where a crack is generated in an element assembly in the vicinity of one outer electrode thereof by tension of a solder fillet, inner electrodes connected to the other outer electrode are prevented from being exposed in a gap of the crack. This suppresses the occurrence of a short circuit of the inner electrodes when moisture enters into the crack.

In the case where a crack is generated in the element assembly by tensile stress due to thermal contraction of the solder fillet and causes the inner electrodes to be cut, electrostatic capacity of the multilayer ceramic capacitor drops. As described above, in the case where a crack is generated in an electronic component by tensile stress due to thermal contraction of a solder fillet, electric characteristics of the electronic component are deteriorated as a result.

SUMMARY OF THE INVENTION

Preferred embodiments of the present invention provide electronic components and methods for manufacturing electronic components in which an occurrence of a crack in an element assembly by tensile stress due to thermal contraction of a solder fillet is significantly reduced or prevented.

An electronic component according to a preferred embodiment of the present invention includes an element assembly in which inner electrodes are embedded and that includes a pair of main surfaces, a pair of side surfaces respectively connecting the main surfaces, and a pair of end surfaces respectively perpendicular or substantially perpendicular to the pair of main surfaces and the pair of side surfaces; and an outer electrode provided on a surface of the element assembly and electrically connected with the inner electrodes. In the electronic component, the outer electrode includes a sintered layer including a sintered metal, a reinforcement layer that does not contain Sn but contains Cu or Ni, an insulation layer including an electric insulation material, and a Sn-containing layer including Sn. The sintered layer extends from each of the end surfaces onto at least one of the main surfaces so as to cover each of the end surfaces. The reinforcement layer covers the entirety of the sintered layer. The insulation layer is directly provided on the reinforcement layer at each of the end surfaces so as to extend in a direction perpendicular or substantially perpendicular to the side surfaces and defines a portion of a surface of the outer electrode. The Sn-containing layer covers the reinforcement layer except for a portion of the reinforcement layer that is covered by the insulation layer and defines another portion of the surface of the outer electrode.

The Sn-containing layer preferably extends from each of the end surfaces to one of the main surfaces.

None of the inner electrodes preferably are located in a virtual plane that links the position of an edge on one of the main surfaces of the insulation layer at the end surface with the position of a tip of the outer electrode on one of the main surfaces in a shortest distance.

The insulation layer preferably is provided on the reinforcement layer at each of the end surfaces so that at least a portion of the insulation layer is located between one of the main surfaces and the position of an edge portion of the inner electrode closest to one of the main surfaces in a direction perpendicular or substantially perpendicular to the main surface.

The sintered layer preferably further extends from each of the end surfaces onto each of the side surfaces. The insulation layer is further provided on the reinforcement layer at each of the side surfaces so as to extend in a direction perpendicular or substantially perpendicular to the end surface.

The outer electrode preferably further includes a base layer which is made of a material different from that of the reinforcement layer and contains Cu or Ni. The base layer is provided between the sintered layer and the reinforcement layer so as to cover the entirety of the sintered layer.

The outer electrode preferably further includes a shield layer which is made of a material different from that of the reinforcement layer and contains Cu or Ni. The shield layer is provided between the reinforcement layer and the Sn-containing layer.

A method for manufacturing an electronic component according to another preferred embodiment of the present invention includes the steps of preparing an element assembly in which inner electrodes are embedded and including a pair of main surfaces, a pair of side surfaces respectively connecting the main surfaces, and a pair of end surfaces respectively perpendicular or substantially perpendicular to the pair of main surfaces and the pair of side surfaces; and providing an outer electrode on a surface of the element assembly so that the outer electrode is electrically connected with the inner electrodes. The step of providing the outer electrode includes a step of providing a sintered layer including a sintered metal, a step of providing a reinforcement layer that does not contain Sn but includes Cu or Ni, a step of providing an insulation layer including an electric insulation material, and a step of providing a Sn-containing layer including Sn. In the step of providing the sintered layer, the sintered layer extends from each of the end surfaces onto at least one of the main surfaces so as to cover each of the end surfaces. In the step of providing the reinforcement layer, the reinforcement layer is provided so as to cover the entirety of the sintered layer. In the step of providing the insulation layer, the insulation layer is directly provided on the reinforcement layer at each of the end surfaces to extend in a direction perpendicular or substantially perpendicular to the side surface so as to define a portion of a surface of the outer electrode. In the step of providing the Sn-containing layer, the Sn-containing layer is provided to cover the reinforcement layer except for a portion of the reinforcement layer that is covered by the insulation layer so as to define another portion of the surface of the outer electrode.

In the step of providing the Sn-containing layer, the Sn-containing layer preferably extends from each of the end surfaces to one of the main surfaces.

In the step of providing the outer electrode, the outer electrode preferably is provided so that none of the inner electrodes are located in a virtual plane which links the position of an edge of the insulation layer at the end surface on one of the main surfaces with the position of a tip of the outer electrode on one of the main surfaces in a shortest distance.

In the step of providing the insulation layer, the insulation layer preferably is provided on the reinforcement layer at each of the end surfaces so that at least a portion of the insulation layer is located between one of the main surfaces and the position of an edge portion of the inner electrode closest to one of the main surfaces in a direction perpendicular or substantially perpendicular to the main surface.

In the step of providing the sintered layer, the sintered layer preferably is provided so as to further extend from each of the end surfaces onto each of the side surfaces. In the step of providing the insulation layer, the insulation layer preferably is further provided directly on the reinforcement layer at each of the side surfaces so as to extend in a direction perpendicular or substantially perpendicular to the end surface.

The step of providing the outer electrode preferably further includes a process of providing a base layer which is formed of a material different from that of the reinforcement layer and contains Cu or Ni. In the step of providing the base layer, the base layer preferably is provided between the sintered layer and the reinforcement layer so as to cover the entirety of the sintered layer.

The step of providing the outer electrode preferably further includes a process of providing a shield layer which is formed of a material different from that of the reinforcement layer and contains Cu or Ni. In the step of providing the shield layer, the shield layer preferably is provided between the reinforcement layer and the Sn-containing layer.

In the step of providing the sintered layer, a dielectric layer included in the element assembly and the sintered layer preferably are baked at the same time.

According to various preferred embodiments of the present invention, an occurrence of a crack in an element assembly caused by tensile stress due to thermal contraction of a solder fillet is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
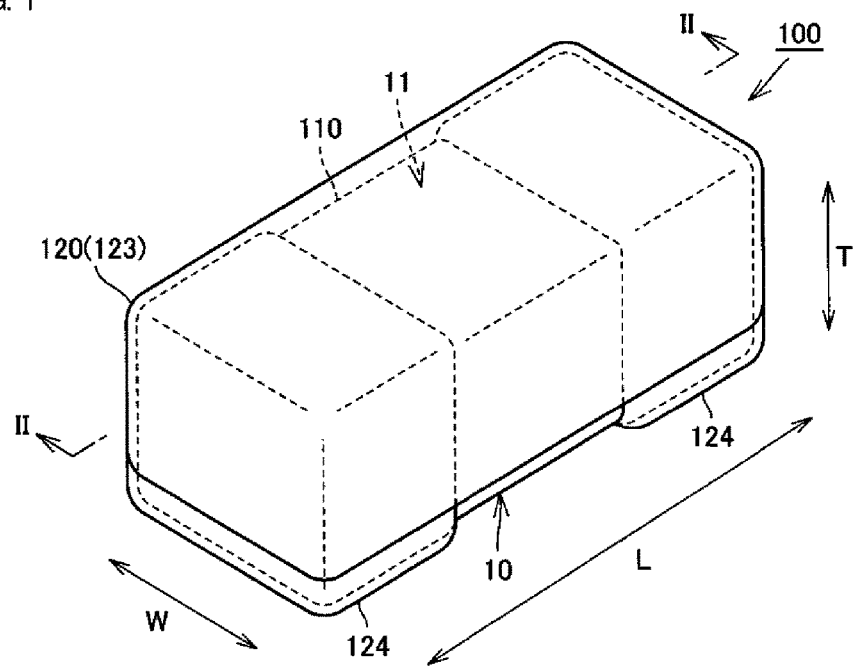
FIG. 1 is a perspective view illustrating an external appearance of an electronic component according to a first preferred embodiment of the present invention.

Hereinafter, electronic components according to preferred embodiments of the present invention will be described with reference to the drawings. In the following description of the preferred embodiments, identical or equivalent members in the drawings are given identical reference numerals and description thereof is not repeated. Further, in the following description, although a multilayer ceramic capacitor will be explained as an electronic component, the electronic component is not intended to be limited to the multilayer ceramic capacitor, and may be a piezoelectric component, a thermistor, an inductor, or the like.

First Preferred Embodiment

Figure 2:
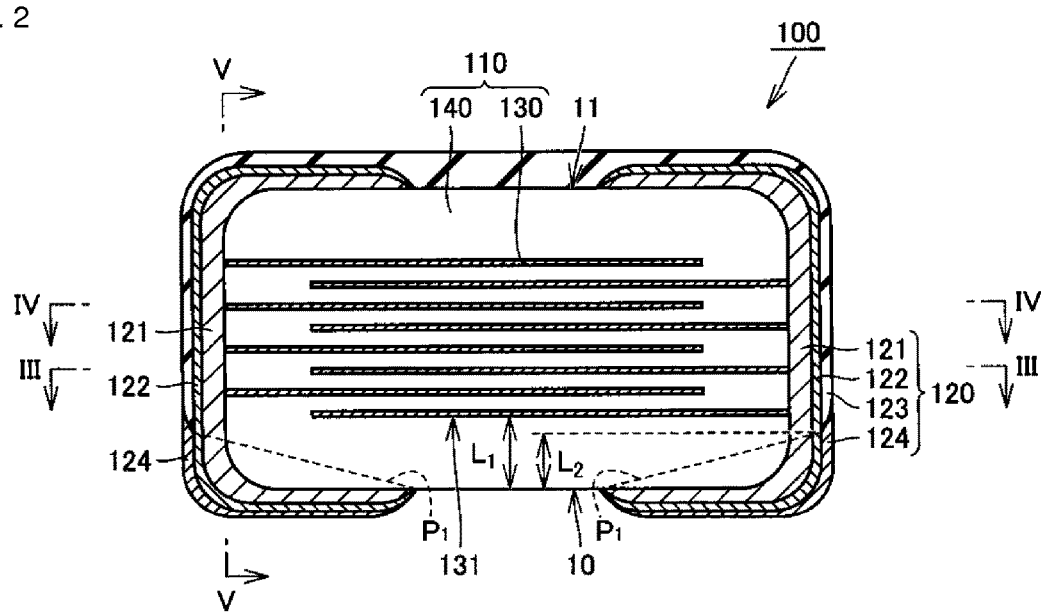
FIG. 2 is a cross-sectional view of the electronic component taken along a II-II arrow line in FIG. 1.
Figure 3:
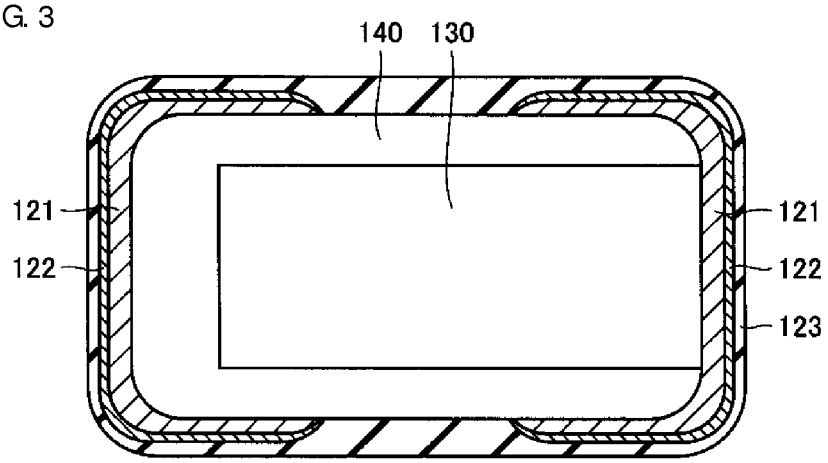
FIG. 3 is a cross-sectional view of the electronic component taken along a III-III arrow line in FIG. 2.
Figure 4:
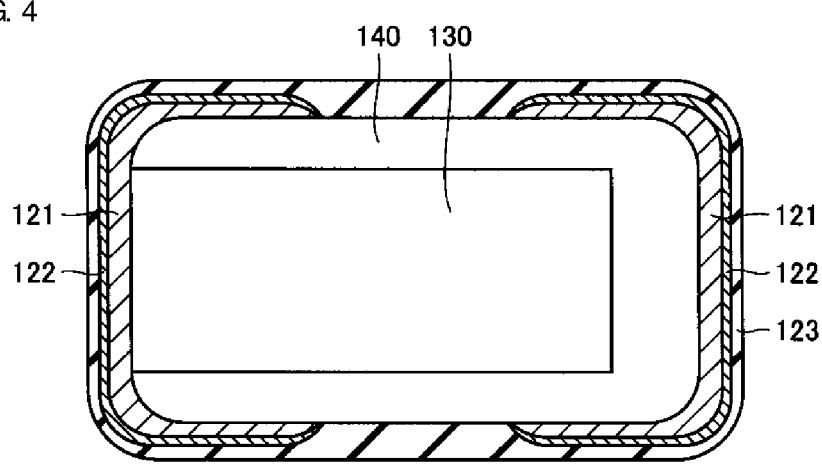
FIG. 4 is a cross-sectional view of the electronic component taken along a IV-IV arrow line in FIG. 2.
Figure 5:
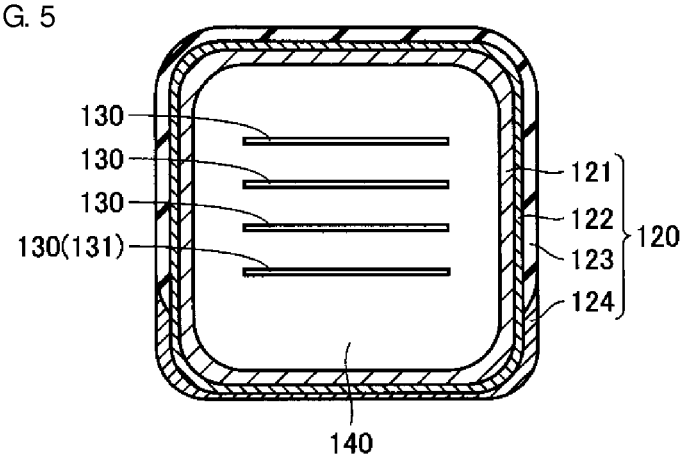
FIG. 5 is a cross-sectional view of the electronic component taken along a V-V arrow line in FIG. 2.

FIG. 1 is a perspective view illustrating an external appearance of an electronic component according to a first preferred embodiment of the present invention. FIG. 2 is a cross-sectional view of the electronic component taken along a II-II arrow line in FIG. 1. FIG. 3 is a cross-sectional view of the electronic component taken along a III-III arrow line in FIG. 2. FIG. 4 is a cross-sectional view of the electronic component taken along a IV-IV arrow line in FIG. 2. FIG. 5 is a cross-sectional view of the electronic component taken along a V-V arrow line in FIG. 2. In FIG. 1, a lengthwise direction of an element assembly, which will be explained later in detail, is indicated by "L", a width direction of the element assembly is indicated by "W", and a thickness direction of the element assembly is indicated by "T".

As shown in FIGS. 1 through 5, an electronic component 100 according to the first preferred embodiment of the present invention includes a parallelepiped-shaped element assembly 110 in which inner electrodes 130 are embedded, and an outer electrode 120 provided on a surface of the element assembly 110 and electrically connected with the inner electrodes 130.

In the element assembly 110, dielectric layers 140 and the inner electrodes 130 having a plate-shaped are alternately stacked. A stacking direction of the dielectric layers 140 and the inner electrodes 130 is perpendicular or substantially perpendicular to both the lengthwise direction L of the element assembly 110 and the width direction W of the element assembly 110. In other words, the stacking direction of the dielectric layers 140 and the inner electrodes 130 is parallel or substantially parallel to the thickness direction T of the element assembly 110.

The element assembly 110 includes a pair of main surfaces perpendicular or substantially perpendicular to the thickness direction T, a pair of end surfaces perpendicular or substantially perpendicular to the lengthwise direction L, and a pair of side surfaces perpendicular or substantially perpendicular to the width direction W. The pair of main surfaces includes one main surface 10 and the other main surface 11. The one main surface 10 is a surface positioned on a mounting surface side of the electronic component 100 when mounted. In other words, when the electronic component 100 is mounted on a substrate, the one main surface 10 is a surface that opposes the substrate.

As described above, the element assembly 110 includes the pair of main surfaces perpendicular or substantially perpendicular to the stacking direction of the dielectric layers 140 and the inner electrodes 130, the pair of side surfaces respectively connecting the main surfaces, and the pair of end surfaces respectively perpendicular or substantially perpendicular to the pair of main surfaces and the pair of side surfaces.

Although the element assembly 110 preferably is parallelepiped shaped with its corners being rounded, the corners of the assembly may not be rounded. Furthermore, concave and/or convex portions may be provided in any one of the surfaces included in the pair of main surfaces, the pair of end surfaces, or the pair of side surfaces.

In the inner electrodes 130 adjacent to each other and opposing each other, one inner electrode 130 is electrically connected with the outer electrode 120 at one end surface of the element assembly 110, while the other inner electrode 130 is electrically connected with the outer electrode 120 at the other end surface of the element assembly 110.

Details of the constituent elements will be described hereinafter.

As a material that configures the dielectric layer 140, dielectric ceramics whose major component is $BaTiO_3$, $CaTiO_3$, $SrTiO_3$, $CaZrO_3$, or the like can be used. Further, a material in which a Mn compound, a Co compound, a Si compound, a rare earth compound, or the like is added as an accessory component to the above major component, may be used.

The inner electrodes 130 preferably have a rectangular or approximately rectangular shape when viewed from above. The inner electrodes 130 adjacent to each other in the stacking direction oppose each other sandwiching the dielectric layer 140 therebetween. The one inner electrodes 130 and the other inner electrodes 130 mentioned above are alternately disposed at equal or substantially equal intervals along the thickness direction T of the element assembly 110.

The one inner electrode 130 extends from one end surface of the element assembly 110 toward the other end surface thereof. As shown in FIG. 3, the one inner electrode 130 is connected with a sintered layer 121 of the outer electrode 120, which will be explained later, at the one end surface of the element assembly 110.

The other inner electrode 130 extends from the other end surface of the element assembly 110 toward the one end surface thereof. As shown in FIG. 4, the other inner electrode 130 is connected with the sintered layer 121 of the outer electrode 120, which will be explained later, at the other end surface of the element assembly 110.

As a material that configures the inner electrode 130, a metal such as Ni, Cu, Ag, Pd, Au, Pt, Sn or the like, or an alloy including at least one of the above metals, for example, an alloy including Ag and Pd, can be used. In the present preferred embodiment, the inner electrode 130 preferably is made of Ni, for example.

As shown in FIG. 2, the outer electrode 120 includes the sintered layer 121 containing a sintered metal, a reinforcement layer 122 that does not contain Sn but includes Cu or Ni, an insulation layer 123 including an electric insulation material, and a Sn-containing layer 124 that contains Sn.

The sintered layer 121 extends from each of the end surfaces onto at least the one main surface 10 so as to cover the end surfaces of the element assembly 110. In the present preferred embodiment, the sintered layer 121 extends from the one end surface onto both the main surfaces and the side surfaces while covering the whole one end surface of the element assembly 110. Further, the sintered layer 121 extends from the other end surface onto both the main surfaces and the side surfaces while covering the whole the other end surface of the element assembly 110. The sintered layer 121 extending from the one end surface of the element assembly 110 onto both the main surfaces and the side surfaces thereof and the sintered layer 121 extending from the other end surface of the element assembly 110 onto both the main surfaces and the side surfaces thereof, are separated from each other and not electrically connected.

As a material that configures the sintered layer 121, a metal such as Ni, Cu, Ag, Pd or the like, or a conductive paste whose major component is an alloy containing at least one of the above metals, can be used. In the present preferred embodiment, a conductive paste whose major component is Cu is applied on the surface of the element assembly 110 and heated at a temperature of approximately 700° C., for example, so that the sintered layer 121 is baked and fixed to the element assembly 110. The sintered layer 121 includes a glass component. In the sintered layer 121, the glass content percentage is higher in a surface layer portion than in an inside portion.

The reinforcement layer 122 is directly provided on the sintered layer 121 so as to cover the entirety of the sintered layer 121. In the present preferred embodiment, the sintered layer 121 extends from the one end surface of the element assembly 110 onto the main surfaces and the side surfaces of the element assembly 110. Further, the sintered layer 121 extends from the other end surface of the element assembly 110 onto the main surfaces and the side surfaces of the element assembly 110.

As such, the reinforcement layer 122 extends from the one end surface of the element assembly 110 onto the main surfaces and the side surfaces of the element assembly 110. Further, the reinforcement layer 122 extends from the other end surface of the element assembly 110 onto the main surfaces and the side surfaces of the element assembly 110.

As a material that configures the reinforcement layer 122, a material that does not contain Sn such as Ni, a Ni alloy, Cu, or a Cu alloy can be used. In the present preferred embodiment, the reinforcement layer preferably is made of Ni, for example.

The insulation layer 123 is directly provided on the reinforcement layer 122 at each of the end surfaces so as to extend in the width direction W, which is a direction perpendicular or substantially perpendicular to the side surface of the element assembly 110, and defines a portion of the surface of the outer electrode 120.

In the present preferred embodiment, the insulation layer 123 extends across the entirety in the width direction W of the element assembly 110 at each end surface of the element assembly 110. As shown in FIG. 2, none of the inner electrodes 130 are located in a virtual plane $P_1$ that links the position of an edge of the insulation layer 123 at the end surface of the element assembly 110 on the one main surface 10 with the position of a tip of the outer electrode 120 on the one main surface 10 of the element assembly 110 in a shortest distance.

In the present preferred embodiment, as shown in FIG. 2, although none of the inner electrodes 130 intersect with virtual lines defining the virtual plane $P_1$ in a cross section of the electronic component 100 on an arbitrary surface parallel or substantially parallel to the side surface of the element assembly 110, the inner electrodes 130 intersecting with the virtual lines may be included therein. However, it is preferable that none of the inner electrodes 130 intersect with the virtual lines.

The insulation layer 123 is directly provided on the reinforcement layer 122 at each end surface of the element assembly 110 such that at least a portion of the insulation layer 123 is located between the one main surface 10 of the element assembly 110 and the position of an edge portion of the inner electrode 130 closest to the one main surface 10 of the element assembly 110 in the thickness direction T, which is a direction perpendicular or substantially perpendicular to the main surfaces of the element assembly 110.

To be more specific, in the case where a dimension of distance between the one main surface 10 of the element assembly 110 and the edge portion on the one main surface 10 of the inner electrode 131 closest to the one main surface 10 is $L_1$, a dimension of distance $L_2$ along the thickness direction T of the element assembly 110 between the one main surface 10 of the element assembly 110 and the position of an end portion on the one main surface 10 of the insulation layer 123 satisfies a relation of $L_2<L_1$ at each end surface of the element assembly 110.

In the present preferred embodiment, $L_2>0$; that is, of the reinforcement layer 122 provided at each of the end surfaces of the element assembly 110, only a portion of the reinforcement layer 122 on the one main surface 10 is not covered by the insulation layer 123. In the case where a dimension of thickness of the element assembly 110 is $L_T$, it is preferable for a relation of $L_2>L_T/10$ to be satisfied for the reason to be explained later. Accordingly, in the electronic component 100, it is preferable for both the relation of $L_2<L_1$ and the relation of $L_2>L_T/10$ to be satisfied. The electronic component 100 satisfies a relation of $L_T/10<L_2<L_1$ in the present preferred embodiment.

The insulation layer 123 extends in the lengthwise direction L, which is a direction perpendicular or substantially perpendicular to the end surface of the element assembly 110, at each of the side surfaces of the element assembly 110. In the present preferred embodiment, the insulation layer 123 extends across the entirety of each side surface of the element assembly 110 along the lengthwise direction L of the element assembly 110. In other words, a portion of the insulation layer 123 is directly provided on the reinforcement layer 122 at each side surface of the element assembly 110. Another portion of the insulation layer 123 is directly provided on each side surface of the element assembly 110.

The insulation layer 123 provided at each end surface of the element assembly 110 and the insulation layer 123 provided at each side surface of the element assembly 110 are connected with each other so as to define a ring-shaped configuration. At each side surface of the element assembly 110, $L_2$ is the dimension of distance along the thickness direction T of the element assembly 110 between the one main surface 10 of the element assembly 110 and the position of the end portion on the one main surface 10 of the insulation layer 123.

Further, the insulation layer 123 covers the entirety of the other main surface 11 side of the element assembly 110. In other words, a portion of the insulation layer 123 is directly provided on the reinforcement layer 122 at the other main surface 11 side of the element assembly 110. Another portion of the insulation layer 123 is directly provided on the other main surface 11 of the element assembly 110. The insulation layer 123 covering the other main surface 11 side of the element assembly 110 is connected with the insulation layer 123 provided at each end surface of the element assembly 110 and the insulation layer 123 provided at each side surface of the element assembly 110, respectively.

As described above, portions of the insulation layer 123 are directly provided on the other main surface 11 of the element assembly 110 and the side surfaces of the element assembly 110. The insulation layer 123 has a higher adhesiveness with the element assembly 110 than with the reinforcement layer 122. Therefore, providing a portion of the insulation layer 123 directly on the element assembly 110 makes it possible to significantly reduce or prevent the separation of the insulation layer 123 at the time of plating or mounting to be explained later.

As a material that configures the insulation layer 123, insulating resin such as a thermosetting curing insulating resin, an ultraviolet curing insulating resin, or the like defining and serving as solder resist can be used.

The Sn-containing layer 124 is provided on the reinforcement layer 122 so as to cover the reinforcement layer 122 except for a portion of the reinforcement layer 122 that is covered by the insulation layer 123 and defines another portion of the surface of the outer electrode 120.

In the present preferred embodiment, the Sn-containing layer 124 extends from each end surface of the element assembly 110 to the one main surface 10 thereof. As described above, of the reinforcement layer 122 provided at each end surface of the element assembly 110, only a portion of the reinforcement layer 122 on the one main surface 10 is not covered by the insulation layer 123. Accordingly, at each end surface of the element assembly 110, the Sn-containing layer 124 covers the portion of the reinforcement layer 122 that is positioned on the one main surface 10 and is not covered by the insulation layer 123.

In addition, the Sn-containing layer 124 covers the reinforcement layer 122 that is not covered by the insulation layer 123 at the one main surface 10 of the element assembly 110. Furthermore, at each side surface of the element assembly 110, the Sn-containing layer 124 covers a portion of the reinforcement layer 122 that is positioned on the one main surface 10 and is not covered by the insulation layer 123.

As described above, the reinforcement layer 122 extends from the one end surface of the element assembly 110 onto both the main surfaces and the side surfaces thereof. Further, the reinforcement layer 122 extends from the other end surface of the element assembly 110 onto both the main surfaces and the side surfaces thereof.

As such, the Sn-containing layer 124 extends from the one end surface of the element assembly 110 to the one main surface 10 and to the side surfaces thereof. Further, the Sn-containing layer 124 extends from the other end surface of the element assembly 110 to the one main surface 10 and to the side surfaces thereof.

The Sn-containing layer 124 extending from the one end surface of the element assembly 110 to the one main surface 10 as well as to the side surfaces of the element assembly 110 and the Sn-containing layer 124 extending from the other end surface of the element assembly 110 to the one main surface 10 as well as to the side surfaces of the element assembly 110, are separated from each other and not electrically connected.

As a material that configures the Sn-containing layer 124, Sn or a Sn alloy, which has a preferable wettability with respect to solder, can be used.

Figure 6:
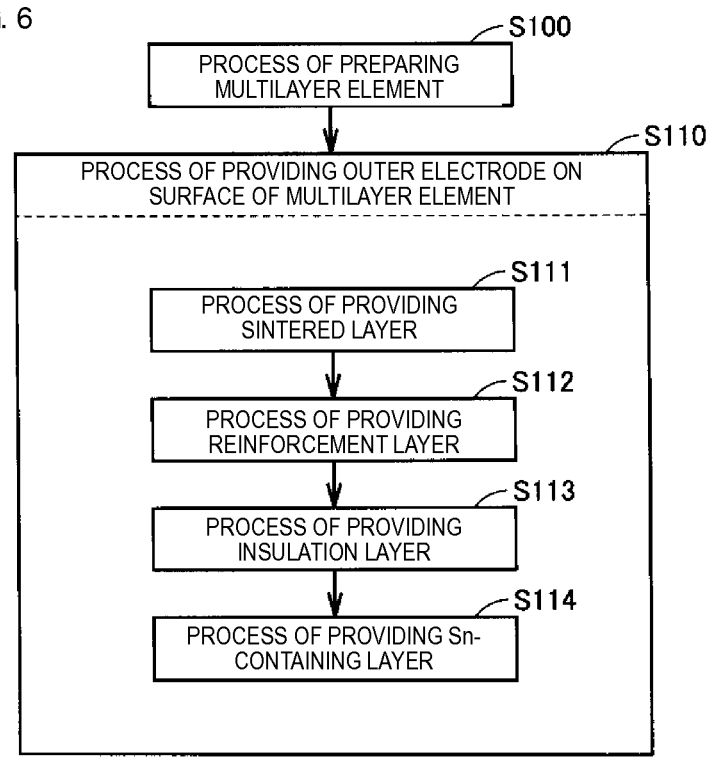
FIG. 6 is a flowchart illustrating a method for manufacturing an electronic component according to the first preferred embodiment of the present invention.

Hereinafter, a non-limiting example of a method for manufacturing an electronic component according to another preferred embodiment will be described. FIG. 6 is a flowchart illustrating a non-limiting example of a method for manufacturing an electronic component according to the present preferred embodiment. As shown in FIG. 6, the method includes a process of preparing the element assembly 110 (S100), and a process of providing an outer electrode 120 on the surface of the element assembly 110 so as for the outer electrode 120 to be electrically connected with the inner electrodes 130 (S110).

The element assembly 110 is preferably manufactured as follows.

First, a ceramic paste containing ceramic powder is applied by a die coater method, a gravure coater method, a micro-gravure coater method, or the like in a sheet state, then the applied paste is dried so as to form a ceramic green sheet.

In some of a plurality of manufactured ceramic green sheets, a conductive paste for forming the inner electrodes is applied on the ceramic green sheets by screen printing, ink jet printing, gravure printing, or the like so that the applied paste forms a predetermined pattern. In this manner, the ceramic green sheets in which the conductive pattern configuring the inner electrodes is formed and the ceramic green sheets in which the conductive patter is not formed are prepared. Note that a known binder and a known solvent may be contained in the ceramic paste and the conductive paste for forming the inner electrodes.

A predetermined number of the ceramic green sheets without the conductive pattern being formed therein are stacked on each other, a plurality of ceramic green sheets with the conductive pattern being formed therein are sequentially stacked on the ceramic green sheets, and then a predetermined number of the ceramic green sheets without the conductive pattern being formed therein are stacked on the sheets with the conductive pattern being formed so as to manufacture a mother block. The mother block may be pressed in the stacking direction using a hydrostatic press method or the like as needed.

By dividing the mother block through cutting into a predetermined shape, a plurality of soft element assemblies each preferably having a parallelepiped shape are manufactured. The parallelepiped soft element assemblies undergo barrel-polishing so that the corners of each of the soft element assemblies are rounded. However, the barrel-polishing is not necessarily needed to be carried out.

The soft element assembly is baked and hardened so as to manufacture the element assembly 110. A temperature at which the baking is carried out is appropriately set in accordance with the respective types of ceramic materials and conductive materials, that is, for example, the temperature is set within a range of no less than approximately 900° C. and no more than approximately 1,300° C.

The process of providing the outer electrode 120 (S110) includes a process of providing the sintered layer 121 containing a sintered metal (S111), a process of providing the reinforcement layer 122 that does not contain Sn but contains Cu or Ni (S112), a process of providing the insulation layer 123 formed of an electric insulation material (S113), and a process of providing the Sn-containing layer 124 that contains Sn (S114).

In the process of providing the sintered layer 121 (S111), the sintered layer 121 extends from each end surface of the element assembly 110 onto at least the one main surface of the element assembly 110 so as to cover each end surface of the element assembly 110. In the present preferred embodiment, the conductive paste to become the sintered layer 121 is applied to both end portions of the element assembly 110 by a dip method. In this manner, in the process of providing the sintered layer 121 (S111), the sintered layer 121 extends from each end surface of element assembly 110 onto the main surfaces of the element assembly 110 as well as onto the side surfaces thereof.

As described above, in the present preferred embodiment, the conductive paste whose major component is Cu is applied on the surface of the element assembly 110 and heated at a temperature of, for example, approximately 700° C. so that the sintered layer 121 is baked and fixed to the element assembly 110. A plurality of sintered layers 121 being layered on each other may be provided by repeating the application and drying of the conductive paste.

In the process of providing the sintered layer (S111), the dielectric layer 140 and the sintered layer 121 preferably are baked at the same time. In other words, by carrying out baking after the conductive paste is applied on the soft element assembly, the element assembly 110 and the sintered layer 121 preferably are formed at the same time.

In the process of providing the reinforcement layer 122 (S112), the reinforcement layer 122 is provided on the sintered layer 121 so as to cover the entirety of the sintered layer 121. In the present preferred embodiment, the reinforcement layer 122 is preferably provided through electroplating. More specifically, the reinforcement layer 122 is preferably provided through barrel-plating. A barrel accommodating the plurality of element assemblies 110 provided with the sintered layer 121 is immersed in a plating liquid within a plating bath, and is electrified while the barrel being rotated in the plating liquid, such that the reinforcement layer 122 is provided on the sintered layer 121.

In the process of providing the insulation layer 123 (S113), the insulation layer 123 is directly provided on the reinforcement layer 122 at each end surface of the element assembly 110 so as to extend in the width direction W, which is a direction perpendicular or substantially perpendicular to the side surface of the element assembly 110, and to define a portion of the surface of the outer electrode 120.

In the present preferred embodiment, the insulation layer 122 is preferably provided by spray-coating of insulating resin such as a thermosetting curing insulating resin, an ultraviolet curing insulating resin, or the like defining and serving as solder resist.

To be more specific, the plurality of element assemblies 110 each provided with the sintered layer 121 and the reinforcement layer 122 are mounted on a plate including a plurality of recesses. Each of the element assemblies 110 provided with the sintered layer 121 and the reinforcement layer 122 is disposed so that the one main surface 10 is accommodated in the recess. The recess is slightly larger than the shape of the main surface 10 of the element assembly 110 provided with the sintered layer 121 and the reinforcement layer 122 when viewed from above. The dimension in depth of the recess is so set as to be equal or approximately equal to the above-mentioned dimension $L_2$. As described earlier, the dimension $L_2$ satisfies the relation of $L_7/10<L_2<L_1$.

With spray-coating performed in a state in which the element assembly 110 is accommodated in the recess, the insulating resin preferably is applied to a portion of the element assembly 110 that is not accommodated in the recess. As a result, as shown in FIG. 1, the insulation layer 123 preferably is provided at the end surfaces, the side surfaces, and the other main surface 11 side of the element assembly 110.

As described above, in the present preferred embodiment, in the process of providing the insulation layer 123 (S113), the insulation layer 123 is further provided on the reinforcement layer 122 at the side surfaces of the element assembly 110 so as to extend in the lengthwise direction L as a direction perpendicular or substantially perpendicular to the end surface of the element assembly 110.

By setting the dimension in depth of the recess to be approximately the same as the dimension $L_2$, in the process of providing the insulation layer 123 (S113), the insulation layer 123 preferably is directly provided on the reinforcement layer 122 at each end surface of the element assembly 110 so that at least a portion of the insulation layer 123 is located between the one main surface 10 of the element assembly 110 and the position of the edge portion of the inner electrode 130 closest to the one main surface 10 of the element assembly 110 in the thickness direction T as a direction perpendicular or substantially perpendicular to the main surface of the element assembly 110.

In the case where a thermosetting curing insulating resin is used as the insulating resin, the insulating resin is cured by heating the element assembly 110 on which the spray-coating has been performed. In the case where an ultraviolet curing insulating resin is used as the insulating resin, the insulating resin is cured by irradiating the element assembly 110, on which the spray-coating has been performed, with ultraviolet light.

It is preferable for thickness of the insulation layer 123 formed of the cured insulating resin to be no less than approximately 10 µm and no more than approximately 50 µm, for example. It is more preferable for the thickness of the insulation layer 123 to be no less than approximately 15 µm and no more than approximately 30 µm, for example.

In the case where the thickness of the insulation layer 123 is smaller than approximately 10 µm, because tensile strength of the insulation layer 123 is insufficient, the insulation layer 123 can be separated or fractured at a time of plating to be explained later when agitation for plating is performed in a plating bath. In the case where the thickness of the insulation layer 123 is larger than approximately 50 µm, because the insulation layer 123 is in a state of projecting to an outer side portion from the shape of the electronic component, an external force is likely to act on the insulation layer 123 at the time of plating to be explained later when the agitation for plating is made in the plating bath, which causes the insulation layer 123 to be easily separated.

The method for forming the insulation layer 123 is not intended to be limited to spray-coating; that is, for example, a dip method, a screen printing method, a photolithography method, or the like may be used instead. As another method for forming the insulation layer 123, the following may be used, for example. That is, in a state in which the plurality of element assemblies 110 provided with the sintered layer 121 and the reinforcement layer 122 are held on a plate with a space therebetween, a softened insulating resin is poured over the plate, thus applying the insulating resin on the surface of each of the element assemblies 110 provided with the sintered layer 121 and the reinforcement layer 122.

In the process of providing the Sn-containing layer 124 (S114), the Sn-containing layer 124 is provided so as to cover the reinforcement layer 122 except for a portion of the reinforcement layer 122 that is covered by the insulation layer 123 to define another portion of the surface of the outer electrode 120.

In the present preferred embodiment, the Sn-containing layer 124 is preferably provided through electroplating. More specifically, the Sn-containing layer 124 is preferably provided through barrel-plating. A barrel accommodating the plurality of element assemblies 110 provided with the sintered layer 121, the reinforcement layer 122, and the insulation layer 123 is immersed in a plating liquid within a plating bath, and is electrified while the barrel being rotated in the plating liquid, such that the Sn-containing layer 124 is provided on the reinforcement layer 122 except for a portion of the reinforcement layer 122 that is covered by the insulation layer 123.

As described above, of the reinforcement layer 122 provided at each end surface of the element assembly 110, only a portion thereof that is on the one main surface 10 is not covered by the insulation layer 123. Accordingly, the Sn-containing layer 124 covers the portion of the reinforcement layer 122 that is positioned on the one main surface 10 and is not covered by the insulation layer 123 at each end surface of the element assembly 110. Further, the Sn-containing layer 124 is configured to cover the reinforcement layer 122 that is not covered by the insulation layer 123 at the one main surface 10 of the element assembly 110. As a result, the Sn-containing layer 124 extends from each end surface of the element assembly 110 to the main surface 10 thereof.

Furthermore, the Sn-containing layer 124 covers a portion of the reinforcement layer 122 that is positioned on the one main surface 10 and is not covered by the insulation layer 123 at each side surface of the element assembly 110. Accordingly, the Sn-containing layer 124 extends from the one end surface of the element assembly 110 to the one main surface 10 of the element assembly 110 as well as to the side surfaces thereof. In addition, the Sn-containing layer 124 extends from the other end surface to the one main surface 10 of the element assembly 110 as well as to the side surfaces thereof.

The electronic component 100 having been manufactured in the manner described above is mounted by soldering. As the solder, Sn—Sb based solder, Sn—Cu based solder, or Sn—Ag based solder can be used.

Figure 7:
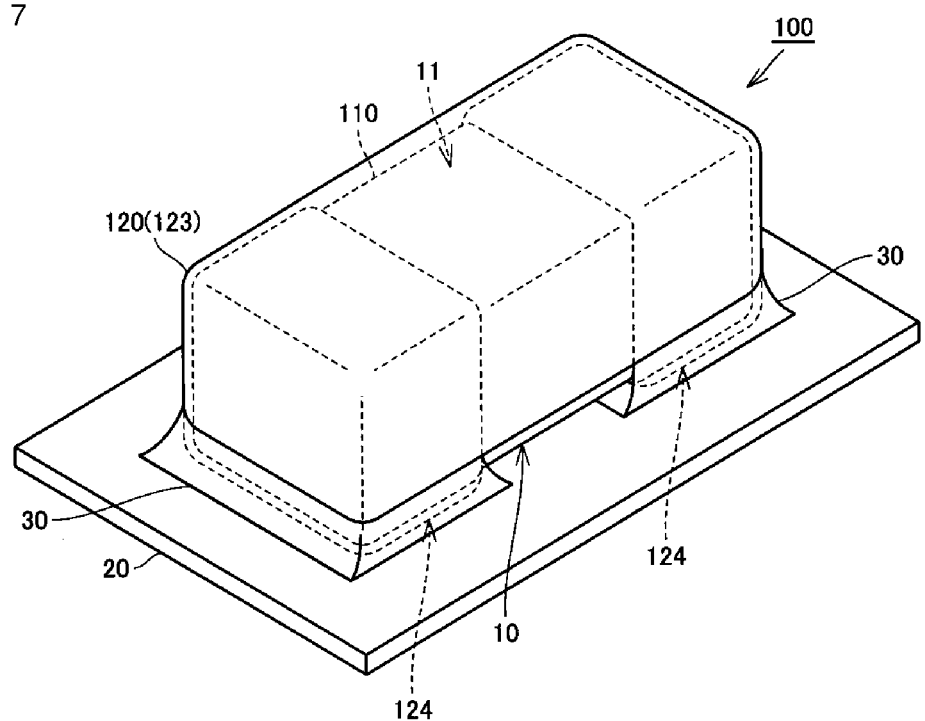
FIG. 7 is a perspective view illustrating a state in which the electronic component according to the first preferred embodiment is mounted on a substrate by soldering.

FIG. 7 is a perspective view illustrating a state in which the electronic component according to the present preferred embodiment is mounted on a substrate by soldering. As shown in FIG. 7, the electronic component 100 is disposed on a substrate 20 so that cream solder which is patterned on the substrate 20 makes contact with the Sn-containing layer 124 of the outer electrode 120, and then the solder reflow is made, such that a solder fillet 30 is formed and the electronic component 100 is mounted on the substrate 20.

In the electronic component 100 according to the present preferred embodiment, because the insulation layer 123 is provided on the surface of the outer electrode 120, the solder fillet 30 cannot wet onto the insulation layer 123. Therefore, the fillet is provided only at a portion of the surface of the outer electrode 120 where the Sn-containing layer 124 that is not covered by the insulation layer 122 is positioned.

In other words, because the insulation layer 123 is provided so as to extend across the entirety of each end surface of the element assembly 110 in the width direction W and across the entirety of each side surface of the element assembly 110 in the lengthwise direction L, wetting of the solder fillet 30 is reduced at the whole perimeter of the element assembly 110.

In the outer electrode 120 of the electronic component 100 according to the present preferred embodiment, as described above, because the insulation layer 123 is directly provided on the reinforcement layer 122 that does not contain Sn, the insulation layer 123 is not separated when the cream solder and the Sn-containing layer 124 are melted and jointed together at the time of the reflow. This makes it possible to effectively reduce the wetting of the solder fillet 30.

Assuming that the insulation layer 123 is provided on the Sn-containing layer 124, when the reflow is carried out and the cream solder and the Sn-containing layer 124 are melted and jointed together, the insulation layer 123 that has been positioned on the melted Sn-containing layer 124 is separated. This allows the solder fillet to wet onto the Sn-containing layer 124 exposed to the exterior because of the separation of the insulation layer 123, thus making it difficult to effectively reduce the wetting of the solder fillet.

In the electronic component 100 according to the present preferred embodiment, the insulation layer 123 is provided at least at each end surface of the element assembly 110, thus making it possible to reduce the wetting of the solder fillet 30 and significantly reduce or prevent the generation of a crack in the element assembly 110 caused by tensile stress due to the thermal contraction of the solder fillet 30.

Furthermore, as described above, none of the inner electrodes 130 are located on the virtual plane $P_1$ that links the position of an edge in the insulation layer 123 at the end surface of the element assembly 110 on the one main surface 10 with the position of a tip of the outer electrode 120 on the one main surface 10 in the shortest distance. If a crack is generated by the tensile stress due to the thermal contraction of the solder fillet 30, the crack is likely to develop along the virtual surface $P_1$. Accordingly, because none of the inner electrodes 130 are located on the virtual plane $P_1$, cutting of the inner electrodes 130 due to the generation of a crack is significantly reduced or prevented. As a result, deterioration of electric characteristics of the electronic component 100 due to the generation of a crack is significantly reduced or prevented.

In addition, as described earlier, in the case where the dimension of distance between the one main surface 10 of the element assembly 110 and the edge portion on the one main surface 10 of the inner electrode 130 is $L_1$, $L_2$ is the dimension of distance along the thickness direction T of the element assembly 110 between the one main surface 10 of the element assembly 110 and the position of an end portion on the one main surface 10 of the insulation layer 123 at each end surface of the element assembly 110, and the dimension of thickness of the element assembly 110 is $L_T$, the relation of $L_T/10 < L_2 < L_1$ is satisfied.

Satisfying the relation of $L_T/10 < L_2$ makes it possible to form an adequate solder fillet 30 and ensure the orientation stability of the electronic component 100 at the time of mounting. Further, falling-off of the electronic component 100 having been mounted from the substrate 20 due to a shock or the like is significantly reduced or prevented.

It is preferable for the insulation layer 123 to cover the reinforcement layer 122 so as to be positioned as the outermost layer at each side surface of the element assembly 110. With this, in the case where the plurality of electronic components 100 are mounted close to each other, even if the electronic components 100 are mounted in a state in which the side surfaces of the adjacent electronic components 100 make contact with each other because of insufficient stability in orientation of the electronic components 100 and the insulation layers 123 thereof are in contact with each other, it is possible to prevent the electronic components 100 that are in contact with each other from being electrically short-circuited.

By satisfying the relation of $L_2 < L_1$, because the solder fillet 30 is not overlapping with a functional region as a region where the inner electrodes 130 are stacked within the element assembly 110, it can be made difficult for the tensile stress produced by the thermal contraction of the solder fillet 30 to act on the functional region. As a result, it is possible to significantly reduce or prevent the generation of a crack due to the thermal contraction of the solder fillet 30.

In addition, satisfying the relation of $L_2 < L_1$ makes it possible to reduce generation of what is called "acoustic noise". The reason for this is as follows.

In the case where the element assembly 110 is configured with a material having piezoelectricity or an electrostrictive property, if a DC voltage in which an AC voltage or an AC component is superposed is applied to the electronic component 100, mechanical distortion vibration is generated in the electronic component 100. Sound is generated from the substrate 20 when the distortion vibration is propagated to the substrate 20. Sound of no less than approximately 20 Hz and no more than approximately 20 kHz serves as an audible sound and gives displeasure to a person. The above phenomenon is what is called "acoustic noise".

In the electronic component 100, it is the functional region that becomes a generation source of the mechanical distortion vibration. The mechanical distortion vibration generated in the functional region is propagated from the outer electrode 120 to the substrate 20 through the solder fillet.

By satisfying the relation of $L_2 < L_1$, because the solder fillet 30 is not overlapping with the functional region, it is possible to reduce the vibration that is propagated from the functional region to the substrate 20 through the solder fillet 30. As a result, the sound generated from the substrate 20 is reduced, in other words, the generation of the "acoustic noise" is reduced. In particular, this method, in which the above relation is satisfied, is noticeably effective for electronic components from which the "acoustic noise" is likely to be generated, such as a multilayer ceramic capacitor that includes the element assembly 110 including the dielectric layer 140 including a dielectric material whose relative permittivity $\in_r$ is no less than approximately 3000, a multilayer ceramic capacitor whose nominal electrostatic capacity preferably is no less than approximately 10 μF, and so on.

Hereinafter, an electronic component and a method for manufacturing the electronic component according to a second preferred embodiment of the present invention will be described. Note that because an electronic component 100a according to the second preferred embodiment differs from the electronic component 100 according to the first preferred embodiment only in a point that the electronic component 100a includes a base layer, description of the other constituent elements is not repeated herein.

Second Preferred Embodiment

Figure 8:
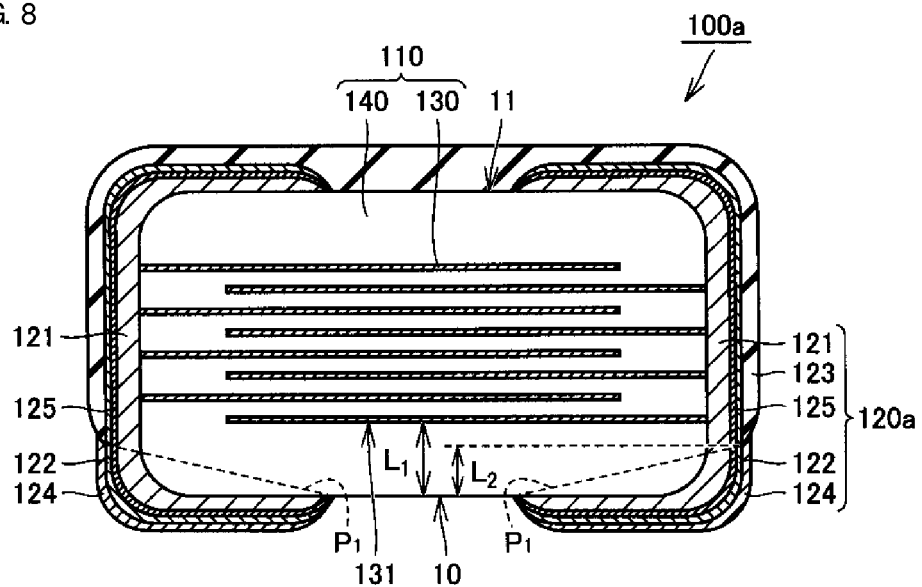
FIG. 8 is a cross-sectional view illustrating a configuration of an electronic component according to a second preferred embodiment of the present invention.
Figure 9:
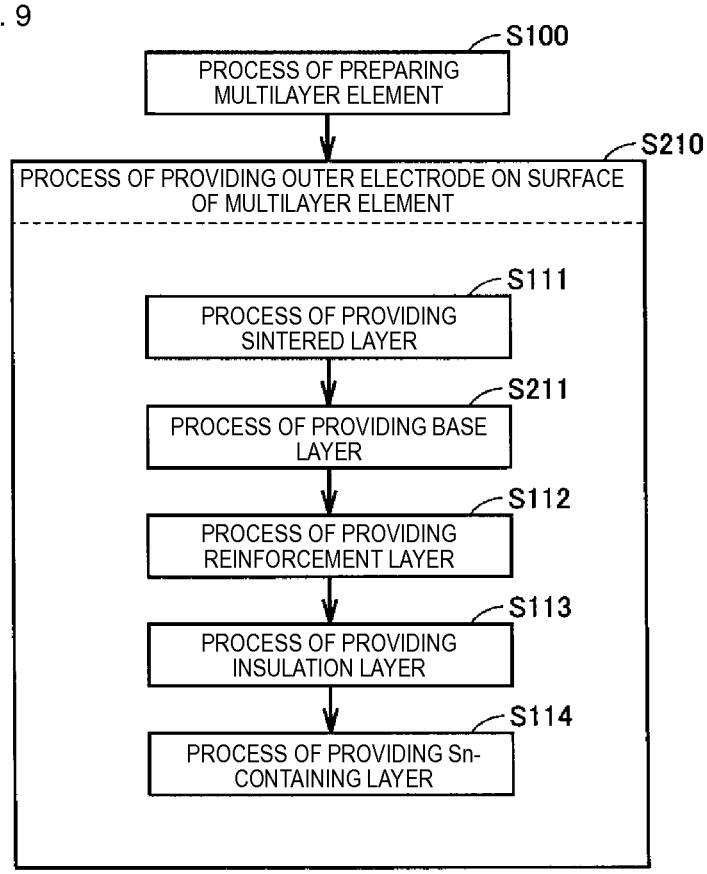
FIG. 9 is a flowchart illustrating a method for manufacturing the electronic component according to the second preferred embodiment of the present invention.

FIG. 8 is a cross-sectional view illustrating a configuration of the electronic component according to the second preferred embodiment of the present invention. FIG. 9 is a flowchart illustrating a method for manufacturing the electronic component according to the second preferred embodiment of the present invention. Note that FIG. 8 illustrates a cross section of the electronic component viewed from the same direction as in FIG. 2.

As shown in FIG. 8, an outer electrode 120a of the electronic component 100a according to the second preferred embodiment of the present invention further includes a base layer 125 which is made of a material different from that of the reinforcement layer 122 and contains Cu or Ni. The base layer 125 is provided between the sintered layer 121 and the reinforcement layer 122 so as to cover the entirety of the sintered layer 121.

The base layer 125 is directly provided on the sintered layer 121 so as to cover the entirety of the sintered layer 121. In the present preferred embodiment, the sintered layer 121 extends from the one end surface of the element assembly 110 onto the main surfaces of the element assembly 110 and the side surfaces thereof. In addition, the sintered layer 121 extends from the other end surface of the element assembly 110 onto the main surfaces of the element assembly 110 and the side surfaces thereof.

As such, the base layer 125 extends from the one end surface of the element assembly 110 to the one main surface 10 of the element assembly 110 and to the side surfaces thereof. In addition, the base layer 125 extends from the other end surface of the element assembly 110 to the one main surface 10 of the element assembly 110 and to the side surfaces thereof.

As a material that configures the base layer 125, a material that is made of a material different from the material configuring the reinforcement layer 122 such as Ni, a Ni alloy, Cu, or a Cu alloy preferably is used. In the present preferred embodiment, the base layer 125 preferably is made of Cu, for example.

In the present preferred embodiment, the reinforcement layer 122 is provided on the base layer 125 so as to cover the entirety of the base layer 125. In the present preferred embodiment, the reinforcement layer 122 preferably is made of Ni, for example.

As shown in FIG. 9, the method for manufacturing the electronic component 100a according to the present preferred embodiment includes the step of preparing the element assembly 110 (S100), a step of providing the outer electrode 120a on the surface of the element assembly 110 so as to be electrically connected with the inner electrodes 130 (S210).

The step of providing the outer electrode 120a (S210) includes a process of providing the sintered layer 121 containing a sintered metal (S111), a step of providing the base layer 125 formed of a material different from that of the reinforcement layer 122 and containing Cu or Ni (S211), the step of providing the reinforcement layer 122 containing Ni or Cu (S112), the step of providing the insulation layer 123 formed of an electric insulation material (S113), and the step of providing the Sn-containing layer 124 that contains Sn (S114).

In the step of providing the base layer 125 (S211), the base layer 125 is provided between the sintered layer 121 and the reinforcement layer 122 so as to cover the entirety of the sintered layer 121. In the present preferred embodiment, the base layer 125 is preferably provided through electroplating. More specifically, the base layer 125 is preferably provided through barrel-plating. A barrel accommodating the plurality of element assemblies 110 provided with the sintered layer 121 is immersed in a plating liquid within a plating bath, and is electrified while the barrel being rotated in the plating liquid, such that the base layer 125 is provided on the sintered layer 121.

In the present preferred embodiment, the reinforcement layer 122 is preferably provided through electroplating. More specifically, the reinforcement layer 122 is preferably provided through barrel-plating. That is, a barrel accommodating the plurality of element assemblies 110 provided with the sintered layer 121 and the base layer 125 is immersed in a plating liquid within a plating bath, and is electrified while the barrel being rotated in the plating liquid, such that the reinforcement layer 122 is provided on the base layer 125.

Providing the reinforcement layer 122 on the base layer 125 makes it possible to provide the reinforcement layer 122 more easily by plating in comparison with a case in which the reinforcement layer 122 is provided on the sintered layer 121.

Also in the electronic component 100a according to the present preferred embodiment, the insulation layer 123 is provided at least at each end surface of the element assembly 110, thus making it possible to reduce the wetting of the solder fillet 30 and significantly reduce or prevent the generation of a crack in the element assembly 110 caused by tensile stress due to the thermal contraction of the solder fillet 30.

Hereinafter, an electronic component and a method for manufacturing the electronic component according to a third preferred embodiment of the present invention will be described. Note that because an electronic component 100b according to the third preferred embodiment differs from the electronic component 100a according to the second preferred embodiment only in a point that the electronic component 100b includes a shield layer, description of the other constituent elements is not repeated herein.

Third Preferred Embodiment

Figure 10:
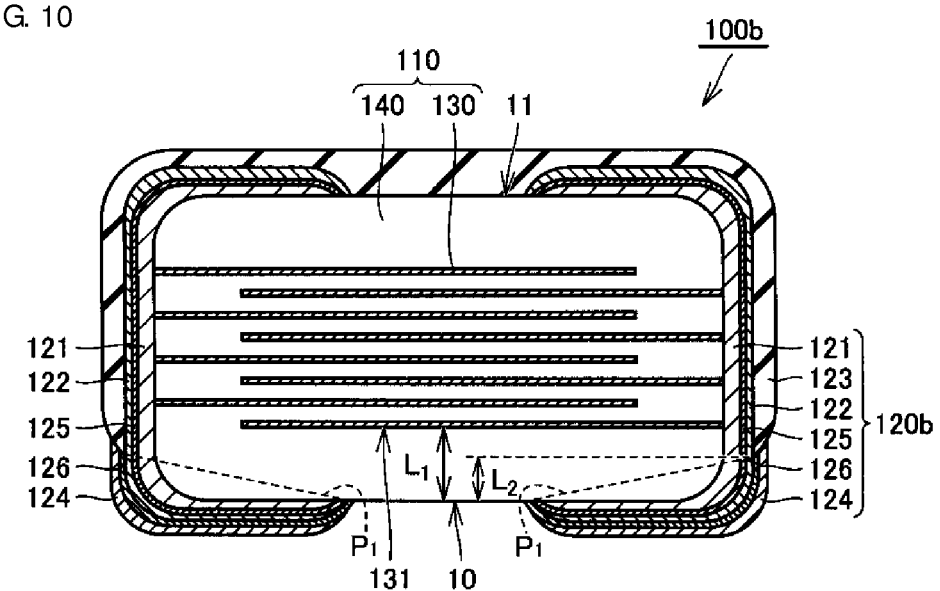
FIG. 10 is a cross-sectional view illustrating a configuration of an electronic component according to a third preferred embodiment of the present invention.
Figure 11:
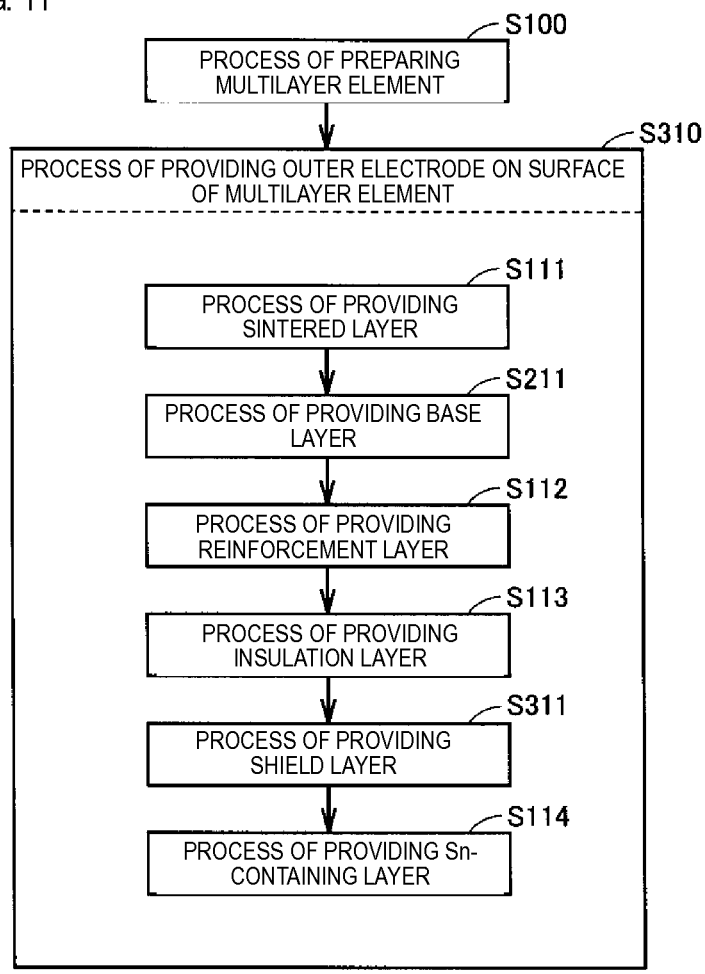
FIG. 11 is a flowchart illustrating a method for manufacturing the electronic component according to the third preferred embodiment of the present invention.

FIG. 10 is a cross-sectional view illustrating a configuration of the electronic component according to the third preferred embodiment of the present invention. FIG. 11 is a flowchart illustrating a method for manufacturing the electronic component according to the third preferred embodiment of the present invention. Note that FIG. 10 illustrates a cross section of the electronic component viewed from the same direction as in FIG. 2.

As shown in FIG. 10, an outer electrode 120b of the electronic component 100b according to the third preferred embodiment of the present invention further includes a shield layer 126 configured of a material different from that of the reinforcement layer 122 and containing Cu or Ni. The shield layer 126 is provided between the reinforcement layer 122 and the Sn-containing layer 124.

The shield layer 126 is provided on the reinforcement layer 122 so as to cover the reinforcement layer 122 except for a portion of the reinforcement layer 122 that is covered by the insulation layer 123. In the present preferred embodiment, the shield layer 126 extends from each end surface of the element assembly 110 to the one main surface 10 thereof. As described above, of the reinforcement layer 122 provided at each end surface of the element assembly 110, only a portion thereof on the one main surface 10 is not covered by the insulation layer 123. Accordingly, the shield layer 126 covers the portion of the reinforcement layer 122 that is not covered by the insulation layer 123 and is positioned on the one main surface 10 at each end surface of the element assembly 110.

Further, the shield layer 126 covers the reinforcement layer 122 that is not covered by the insulation layer 123 at the one main surface 10 of the element assembly 110. Furthermore, the shield layer 126 covers a portion of the reinforcement layer 122 that is not covered by the insulation layer 123 and is positioned on the one main surface 10 at each side surface of the element assembly 110.

As described earlier, the reinforcement layer 122 extends from the one end surface of the element assembly 110 onto the main surfaces of the element assembly 110 and the side surfaces thereof. In addition, the reinforcement layer 122 extends from the other end surface of the element assembly 110 onto the main surfaces of the element assembly 110 and the side surfaces thereof.

As such, the shield layer 126 extends from the one end surface of the element assembly 110 to the one main surface 10 of the element assembly 110 and to the side surfaces thereof. In addition, the shield layer 126 extends from the other end surface of the element assembly 110 to the one main surface 10 of the element assembly 110 and to the side surfaces thereof.

As a material that configures the shield layer 126, a material that differs from the material configuring the reinforcement layer 122 such as Ni, a Ni alloy, Cu, or a Cu alloy can be used. In the present preferred embodiment, the shield layer 126 is preferably made of Cu, for example.

The shield layer 126 preferably is configured to overlie an end portion of the insulation layer 123 by several μm, for example. In this case, it is preferable for the insulation layer 123 to have a large surface roughness. Further, it is preferable for the dimension in length of the shield layer 126 at a portion thereof that overlies the end portion of the insulation layer 123 along the thickness direction T of the element assembly 110 to be larger than the dimension in thickness of the shield layer 126. With this, the shield layer 126 overlying the end portion of the insulation layer 123 penetrates into recessed areas in the surface of the insulation layer 123 in a spike-shaped configuration, thus enhancing the adhesiveness between the shield layer 126 and the insulation layer 123. As a result, the boundary between the insulation layer 123 and the shield layer 126 is so tightly bonded that the solder fillet entering the boundary between the insulation layer 123 and the shield layer 126 is further significantly reduced or prevented at the time of mounting.

As shown in FIG. 11, the method for manufacturing the electronic component 100b according to the present preferred embodiment includes the process of preparing the element assembly 110 (S100), and a process of providing the outer electrode 120b on the surface of the element assembly 110 so as to be electrically connected with the inner electrodes 130 (S310).

The process of providing the outer electrode 120b (S310) includes the process of providing the sintered layer 121 including a sintered metal (S111), the process of providing the base layer 125 including a material different from that of the reinforcement layer 122 and containing Cu or Ni (S211), the process of providing the reinforcement layer 122 containing Ni or Cu (S112), the process of providing the insulation layer 123 including an electric insulation material (S113), a process of providing the shield layer 126 configured of a material different from that of the reinforcement layer 122 and containing Cu or Ni (S311), and the process of providing the Sn-containing layer 124 that includes Sn (S114).

In the process of providing the shield layer 126 (S311), the shield layer 126 is provided so as to cover the reinforcement layer 122 except for a portion of the reinforcement layer 122 that is covered by the insulation layer 123. In the present preferred embodiment, the shield layer 126 is provided through electroplating. More specifically, the shield layer 126 is preferably provided through the barrel-plating. That is, the barrel accommodating the plurality of element assemblies 110 provided with the sintered layer 121, the base layer 125, the reinforcement layer 122, and the insulation layer 123 is immersed in a plating liquid within the plating bath, and is electrified while the barrel being rotated in the plating liquid, such that the shield layer 126 is provided on the reinforcement layer 122 except for a portion of the reinforcement layer 122 that is covered by the insulation layer 123.

As described above, of the reinforcement layer 122 provided at each end surface of the element assembly 110, only a portion thereof that is on the one main surface 10 is not covered by the insulation layer 123. Accordingly, the shield layer 126 covers the portion of the reinforcement layer 122 that is positioned on the one main surface 10 and is not covered by the insulation layer 123 at each end surface of the element assembly 110. Further, the shield layer 126 is configured to cover the reinforcement layer 122 that is not covered by the insulation layer 123 at the one main surface 10 of the element assembly 110. As a result, the shield layer 126 extends from each end surface of the element assembly 110 to the main surface 10 thereof.

Furthermore, the shield layer 126 covers a portion of the reinforcement layer 122 that is positioned on the one main surface 10 and is not covered by the insulation layer 123 at each of the side surfaces of the element assembly 110. Accordingly, the shield layer 126 extends from the one end surface of the element assembly 110 to the one main surface 10 of the element assembly 110 as well as to each of the side surfaces thereof. In addition, the shield layer 126 extends from the other end surface of the element assembly 110 to the one main surface 10 of the element assembly 110 as well as to each of the side surfaces thereof.

In the process of providing the Sn-containing layer 124 (S114), the Sn-containing layer 124 is provided on the shield layer 126 so as to cover the reinforcement layer 122 except for a portion of the reinforcement layer 122 that is covered by the insulation layer 123 and to define another portion of the surface of the outer electrode 120.

In the present preferred embodiment, the Sn-containing layer 124 is preferably provided through electroplating. More specifically, the Sn-containing layer 124 is preferably provided through barrel-plating. That is, a barrel accommodating the plurality of element assemblies 110 provided with the sintered layer 121, the base layer 125, the reinforcement layer 122, the insulation layer 123, and the shield layer 126 is immersed in a plating liquid within a plating bath, and is electrified while the barrel being rotated in the plating liquid, such that the Sn-containing layer 124 is provided on the shield layer 126. As a result, the Sn-containing layer 124 extends from each end surface of the element assembly 110 to the one main surface 10 thereof. Further, the Sn-containing layer 124 is provided on the shield layer 126 at each side surface of the element assembly 110.

As such, the Sn-containing layer 124 extends from the one end surface of the element assembly 110 to the one main surface 10 and to the side surfaces of the element assembly 110. Further, the Sn-containing layer 124 extends from the other end surface of the element assembly 110 to the one main surface 10 and to the side surfaces of the element assembly 110.

Also in the electronic component 100b according to the present preferred embodiment, the insulation layer 123 is provided at least at each end surface of the element assembly 110, thus making it possible to reduce the wetting of the solder fillet 30 and significantly reduce or prevent the generation of a crack in the element assembly 110 caused by tensile stress due to the thermal contraction of the solder fillet 30. Note that the base layer 125 may not be provided in some case.

Hereinafter, an electronic component according to a fourth preferred embodiment of the present invention will be described. Note that because an electronic component 400 according to the fourth preferred embodiment differs from the electronic component 100 according to the first preferred embodiment only in a point that the positions of the insulation layer and Sn-containing layer are different from those in the first preferred embodiment, description of the other constituent elements is not repeated herein.

Fourth Preferred Embodiment

Figure 12:
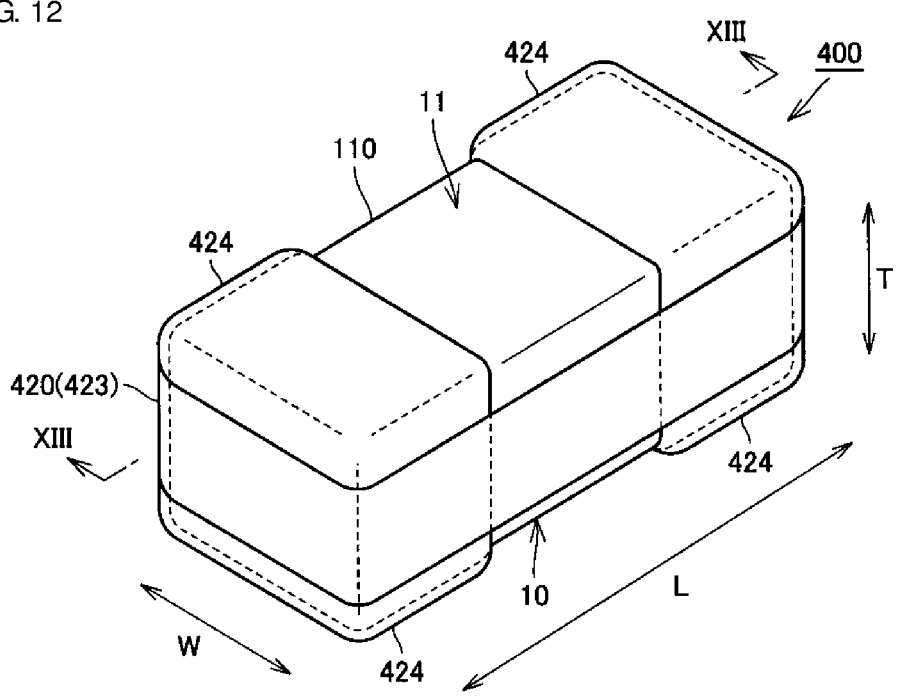
FIG. 12 is a perspective view illustrating an external appearance of an electronic component according to a fourth preferred embodiment of the present invention.
Figure 13:
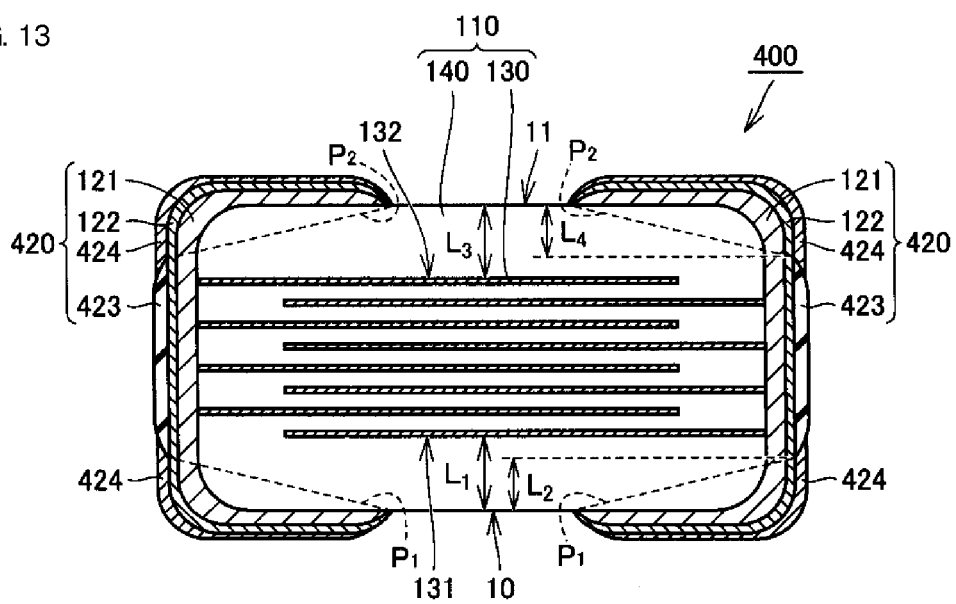
FIG. 13 is a cross-sectional view of the electronic component taken along a XIII-XIII arrow line in FIG. 12.

FIG. 12 is a perspective view illustrating an external appearance of the electronic component according to the fourth preferred embodiment of the present invention. FIG. 13 is a cross-sectional view of the electronic component taken along a XIII-XIII arrow line in FIG. 12.

As shown in FIGS. 12 and 13, the electronic component 400 according to the fourth preferred embodiment of the present invention includes the element assembly 110 and outer electrodes 420 provided on the surface of the element assembly 110 and electrically connected with the inner electrodes 130. The outer electrodes 420 each include the sintered layer 121 including a sintered metal, the reinforcement layer 122 that does not contain Sn but includes Cu or Ni, an insulation layer 423 including an electric insulation material, and a Sn-containing layer 424 that includes Sn.

The insulation layer 423 is directly provided on the reinforcement layer 122 at each end surface so as to extend in the width direction W, which is a direction perpendicular or substantially perpendicular to the side surface of the element assembly 110, and defines a portion of a surface of the outer electrode 420.

In the present preferred embodiment, the insulation layer 423 extends across the entirety in the width direction W of the element assembly 110 at each end surface of the element assembly 110. As shown in FIG. 13, none of the inner electrodes 130 are located on the virtual plane $P_1$ that links the position of an edge of the insulation layer 423 at the end surface of the element assembly 110 on the one main surface 10 thereof with the position of a tip of the outer electrode 420 on the one main surface 10 of the element assembly 110 in a shortest distance.

Note that in the present preferred embodiment, as shown in FIG. 13, although none of the inner electrodes 130 intersect with the virtual lines defining the virtual plane $P_1$ in a cross section of the electronic component 400 on an arbitrary surface parallel or substantially parallel to the side surface of the element assembly 110, the inner electrodes 130 intersecting with the virtual lines preferably are included therein. However, it is preferable that none of the inner electrodes 130 intersect with the virtual lines.

The insulation layer 423 is directly provided on the reinforcement layer 122 at each end surface of the element assembly 110 so that at least a portion of the insulation layer 423 is located between the one main surface 10 of the element assembly 110 and the position of an edge portion of the inner electrode 130 closest to the one main surface 10 of the element assembly 110 in the thickness direction T, which is a direction perpendicular or substantially perpendicular to the main surface of the element assembly 110.

To be more specific, in the case where the dimension of distance between the one main surface 10 of the element assembly 110 and the edge portion on the one main surface 10 of the inner electrode 130 is $L_1$, the dimension of distance $L_2$ along the thickness direction T of the element assembly 110 between the one main surface 10 of the element assembly 110 and the position of an end portion on the one main surface 10 of the insulation layer 423 satisfies the relation of $L_2 < L_1$, at each end surface of the element assembly 110.

In the present preferred embodiment, $L_2 > 0$; that is, of the reinforcement layer 122 provided at each of the end surfaces of the element assembly 110, a portion of the reinforcement layer 122 on the one main surface 10 is not covered by the insulation layer 423. In the case where the dimension of thickness of the element assembly 110 is $L_T$, it is more preferable for the relation of $L_2 > L_T/10$ to be satisfied. Accordingly, in the electronic component 400, it is preferable for both the relation of $L_2 < L_1$ and the relation of $L_2 > L_T/10$ to be satisfied. The electronic component 400 satisfies the relation of $L_T/10 < L_2 < L_1$ in the present preferred embodiment.

As shown in FIG. 13, the insulation layer 423 is provided such that none of the inner electrodes 130 are located in a virtual plane $P_2$ that links the position of an edge of the insulation layer 423 at the end surface of the element assembly 110 on the other main surface 11 side with the position of a tip of the outer electrode 420 on the other main surface 11 side of the element assembly 110 in a shortest distance.

Note that in the present preferred embodiment, as shown in FIG. 13, although none of the inner electrodes 130 intersect with virtual lines defining the virtual plane $P_2$ in a cross section of the electronic component 400 on an arbitrary surface parallel or substantially parallel to the side surface of the element assembly 110, the inner electrodes 130 intersecting with the virtual lines may be included therein. However, it is preferable that none of the inner electrodes 130 intersect with the virtual lines.

The insulation layer 423 is directly provided on the reinforcement layer 122 at each end surface of the element assembly 110 such that at least a portion of the insulation layer 423 is located between the other main surface 11 of the element assembly 110 and the position of an edge portion of the inner electrode 130 closest to the other main surface 11 of the element assembly 110 in the thickness direction T, which is a direction perpendicular or substantially perpendicular to the main surface of the element assembly 110.

To be more specific, in the case where a dimension of distance between the other main surface 11 of the element assembly 110 and an edge portion on the other main surface 11 side of the inner electrode 130 closest to the other main surface 11 is $L_3$, a dimension of distance $L_4$ along the thickness direction T of the element assembly 110 between the other main surface 11 of the element assembly 110 and the position of an end portion on the other main surface 11 side of the insulation layer 423 satisfies a relation of $L_4 < L_3$, at each end surface of the element assembly 110.

In the present preferred embodiment, $L_4 > 0$; that is, of the reinforcement layer 122 provided at each of the end surfaces of the element assembly 110, a portion of the reinforcement layer 122 on the other main surface 11 side is not covered by the insulation layer 423. In the case where the dimension of thickness of the element assembly 110 is $L_T$, it is more preferable for a relation of $L_4 > L_T/10$ to be satisfied. Accordingly, in the electronic component 400, it is preferable for both the relation of $L_4 < L_3$ and the relation of $L_4 > L_T/10$ to be satisfied. The electronic component 400 satisfies a relation of $L_T/10 < L_4 < L_3$ in the present preferred embodiment.

The insulation layer 423 extends in the lengthwise direction L, which is a direction perpendicular or substantially perpendicular to the end surface of the element assembly 110, at each side surface of the element assembly 110. In the present preferred embodiment, the insulation layer 423 extends across the entirety of each side surface of the element assembly 110 along the lengthwise direction L of the element assembly 110. In other words, a portion of the insulation layer 423 is directly provided on the reinforcement layer 122 at each side surface of the element assembly 110. Another portion of the insulation layer 423 is directly provided on each side surface of the element assembly 110.

The insulation layer 423 provided at each end surface of the element assembly 110 and the insulation layer 423 provided at each side surface of the element assembly 110 are connected with each other so as to define a ring-shaped configuration. At each side surface of the element assembly 110, $L_2$ is the dimension of distance along the thickness direction T of the element assembly 110 between the one main surface 10 of the element assembly 110 and the position of the end portion on the one main surface 10 of the insulation layer 423. At each side surface of the element assembly 110, $L_4$ is the dimension of distance along the thickness direction T of the element assembly 110 between the other main surface 11 of the element assembly 110 and the position of the end portion on the other main surface 11 side of the insulation layer 423. In the present preferred embodiment, the dimension $L_2$ and the dimension $L_4$ are the same.

As a method for forming the insulation layer 423, the following may be used, for example. That is, in a state in which the plurality of element assemblies 110 provided with the sintered layer 121 and the reinforcement layer 122 are arranged with a space therebetween and sandwiched between two elastic plates, a softened insulating resin is poured between the two plates, thus applying the insulating resin on the surface of the element assemblies 110 provided with the sintered layer 121 and the reinforcement layer 122. Through this, because the insulating resin does not adhere to the element assembly 110 provided with the sintered layer 121 and the reinforcement layer 122 at portions that are sunk in the two plates, the insulation layer 423 preferably is formed.

The Sn-containing layer 424 is provided on the reinforcement layer 122 so as to cover the reinforcement layer 122 except for a portion of the reinforcement layer 122 that is covered by the insulation layer 423, and defines another portion of the surface of the outer electrode 420.

In the present preferred embodiment, the Sn-containing layer 424 extends from each end surface of the element assembly 110 to the one main surface 10 of the element assembly 110 as well as to the other main surface 11 side thereof. As described before, of the reinforcement layer 122 provided at each end surface of the element assembly 110, a portion of the reinforcement layer 122 on the one main surface 10 and a portion of the reinforcement layer 122 on the other main surface 11 side are not covered by the insulation layer 423. Accordingly, at each end surface of the element assembly 110, the Sn-containing layer 424 covers the portion of the reinforcement layer 122 positioned on the one main surface 10 and the portion of the reinforcement layer 122 positioned on the other main surface 11 side.

Further, the Sn-containing layer 424 covers the reinforcement layer 122 that is not covered by the insulation layer 423 at the one main surface 10 of the element assembly 110 and the other main surface 11 side thereof. Furthermore, at each side surface of the element assembly 110, the Sn-containing layer 424 covers a portion of the reinforcement layer 122 that is positioned on the one main surface 10 and is not covered by the insulation layer 423 and a portion of the reinforcement layer 122 that is positioned on the other main surface 11 side and is not covered by the insulation layer 423.

As described earlier, the reinforcement layer 122 extends from the one end surface of the element assembly 110 onto both the main surfaces and the side surfaces of the element assembly 110. Further, the reinforcement layer 122 extends from the other end surface of the element assembly 110 onto both the main surfaces and the side surfaces of the element assembly 110.

As such, the Sn-containing layer 424 extends from the one end surface of the element assembly 110 to the one main surface 10 and to the side surfaces of the element assembly 110. Likewise, the Sn-containing layer 424 extends from the one end surface of the element assembly 110 to the other main surface 11 side and to the side surfaces of the element assembly 110.

Furthermore, the Sn-containing layer 424 extends from the other end surface of the element assembly 110 to the one main surface 10 and to the side surfaces of the element assembly 110. Likewise, the Sn-containing layer 424 extends from the other end surface of the element assembly 110 to the other main surface 11 side and to the side surfaces of the element assembly 110.

In the present preferred embodiment, in the outer electrode 420 of the electronic component 400, either of the one main surface 10 and the other main surface 11 side of the element assembly 110 can be selected as a mounting surface with respect to the substrate 20.

In other words, in the outer electrode 420 of the electronic component 400, regardless of which one of the one main surface 10 and the other main surface 11 side of the element assembly 110 is selected as the mounting surface, it is possible to reduce the wetting of the solder fillet 30 and significantly reduce or prevent the generation of a crack in the element assembly 110 caused by tensile stress due to the thermal contraction of the solder fillet 30.

Therefore, in the electronic component 400 according to the present preferred embodiment, the electronic component 400 can be mounted without being limited by the orientation of the electronic component 400 in the thickness direction T of the element assembly 110.

Hereinafter, an electronic component according to a fifth preferred embodiment of the present invention will be described. Because an electronic component 500 according to the fifth preferred embodiment differs from the electronic component 100 according to the first preferred embodiment only in a point that the stacking direction of the inner electrodes is different from that in the first preferred embodiment, description of the other constituent elements is not repeated herein.

Fifth Preferred Embodiment

Figure 14:
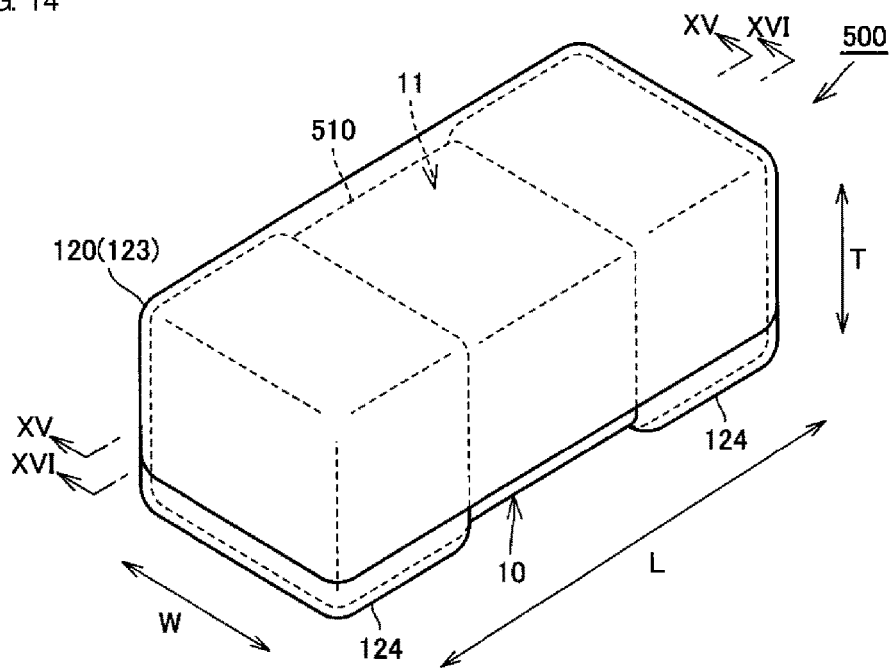
FIG. 14 is a perspective view illustrating an external appearance of an electronic component according to a fifth preferred embodiment of the present invention.
Figure 15:
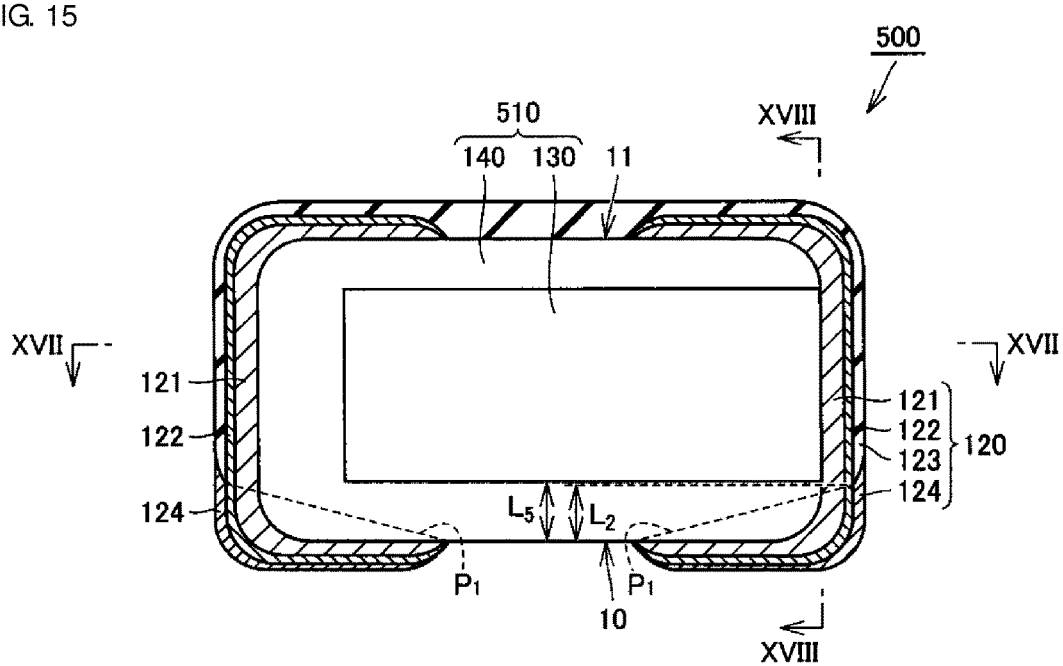
FIG. 15 is a cross-sectional view of the electronic component taken along a XV-XV arrow line in FIG. 14.
Figure 16:
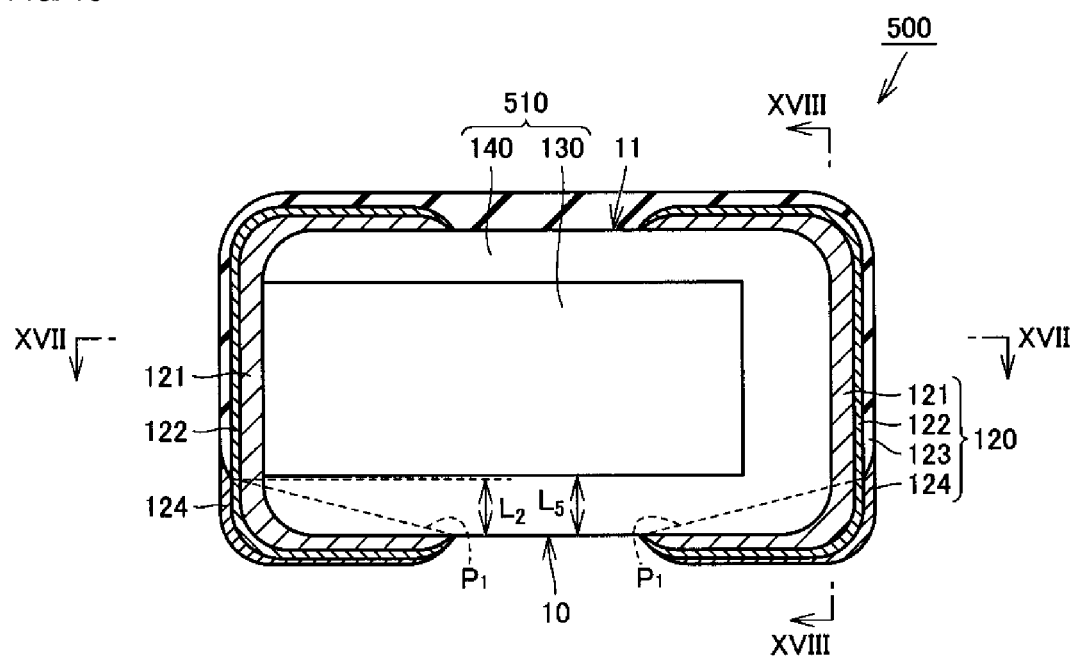
FIG. 16 is a cross-sectional view of the electronic component taken along a XVI-XVI arrow line in FIG. 14.
Figure 17:
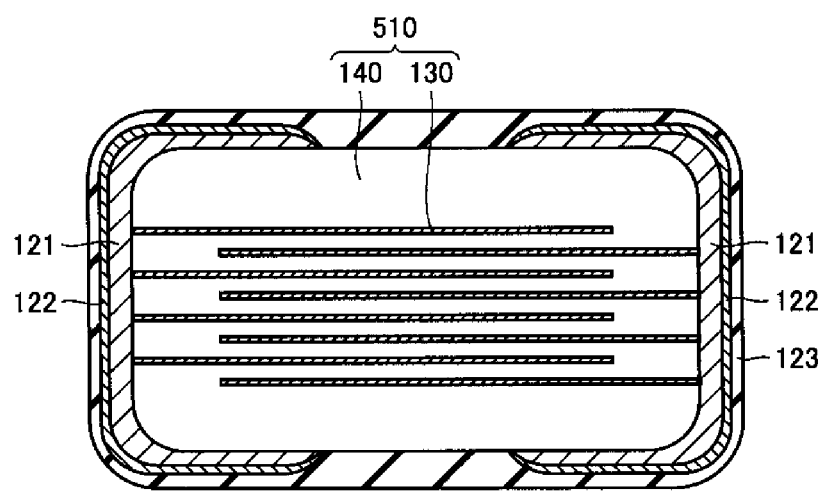
FIG. 17 is a cross-sectional view of the electronic component taken along a XVII-XVII arrow line in FIG. 15 and of the electronic component taken along the XVII-XVII arrow line in FIG. 16.
Figure 18:
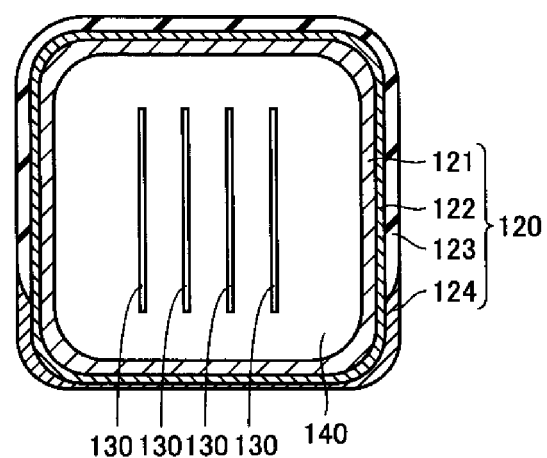
FIG. 18 is a cross-sectional view of the electronic component taken along a XVIII-XVIII arrow line in FIG. 15 and of the electronic component taken along the XVIII-XVIII arrow line in FIG. 16.

FIG. 14 is a perspective view illustrating an external appearance of the electronic component according to the fifth preferred embodiment of the present invention. FIG. 15 is a cross-sectional view of the electronic component taken along a XV-XV arrow line in FIG. 14. FIG. 16 is a cross-sectional view of the electronic component taken along a XVI-XVI arrow line in FIG. 14. FIG. 17 is a cross-sectional view of the electronic component taken along a XVII-XVII arrow line in FIG. 15 and of the electronic component taken along the XVII-XVII arrow line in FIG. 16 as well. FIG. 18 is a cross-sectional view of the electronic component taken along a XVIII-XVIII arrow line in FIG. 15 and of the electronic component taken along the XVIII-XVIII arrow line in FIG. 16 as well. In FIG. 14, a lengthwise direction of an element assembly is indicated by "L", a width direction of the element assembly is indicated by "W", and a thickness direction of the element assembly is indicated by "T".

As shown in FIGS. 14 through 18, the electronic component 500 according to the fifth preferred embodiment of the present invention includes a parallelepiped-shaped element assembly 510 in which the inner electrodes 130 are embedded, and the outer electrode 120 provided on a surface of the element assembly 510 and electrically connected with the inner electrodes 130.

In the element assembly 510, the dielectric layers 140 and the inner electrodes 130 having a plate-shaped are alternately stacked. The stacking direction of the dielectric layers 140 and the inner electrodes 130 is perpendicular or substantially perpendicular to both the lengthwise direction L of the element assembly 510 and the thickness direction T of the element assembly 510. In other words, the stacking direction of the dielectric layers 140 and the inner electrodes 130 is parallel or substantially parallel to the width direction W of the element assembly 510.

The element assembly 510 includes a pair of main surfaces perpendicular or substantially perpendicular to the thickness direction T, a pair of end surfaces perpendicular or substantially perpendicular to the lengthwise direction L, and a pair of side surfaces perpendicular or substantially perpendicular to the width direction W. The pair of main surfaces includes the one main surface 10 and the other main surface 11. The one main surface 10 is a surface positioned on a mounting surface side of the electronic component 500 when the electronic component 500 is mounted. In other words, when the electronic component 500 is mounted on a substrate, the one main surface 10 is a surface that opposes the substrate.

As described above, the element assembly 510 includes the pair of side surfaces perpendicular or substantially perpendicular to the stacking direction of the dielectric layers 140 and the inner electrodes 130, the pair of main surfaces respectively connecting the side surfaces, and the pair of end surfaces respectively perpendicular or substantially perpendicular to the pair of main surfaces and the pair of side surfaces.

Although the element assembly 510 preferably has a parallelepiped shape with its corners being rounded, the corners of the assembly may not be rounded. Furthermore, concave and/or convex portions may be provided in any one of the surfaces included in the pair of main surfaces, the pair of end surfaces, or the pair of side surfaces.

In the inner electrodes 130 adjacent to each other and opposing each other, one inner electrode 130 is electrically connected with the outer electrode 120 at one end surface of the element assembly 510, while the other inner electrode 130 is electrically connected with the outer electrode 120 at the other end surface of the element assembly 510.

In the present preferred embodiment, the insulation layer 123 extends across the entirety in the width direction of the element assembly 510 at each end surface of the element assembly 510. As shown in FIGS. 15 and 16, none of the inner electrodes 130 are located in a virtual plane $P_1$ that links the position of an edge in the insulation layer 123 at the end surface of the element assembly 510 on the one main surface 10 with the position of a tip of the outer electrode 120 on the one main surface 10 of the element 510 in a shortest distance.

Note that in the present preferred embodiment, as shown in FIGS. 15 and 16, although none of the inner electrodes 130 intersect with virtual lines defining the virtual plane $P_1$ in a cross section of the electronic component 500 on an arbitrary surface parallel or substantially parallel to the side surface of the element assembly 510, the inner electrodes 130 intersecting with the virtual lines may be included therein. However, it is preferable that none of the inner electrodes 130 intersect with the virtual lines.

The insulation layer 123 is directly provided on the reinforcement layer 122 at each end surface of the element assembly 510 so that at least a portion of the insulation layer 123 is located between the one main surface 10 of the element assembly 510 and the position of an edge portion of the inner electrode 130 closest to the one main surface 10 of the element assembly 510 in the thickness direction T, which is a direction perpendicular or substantially perpendicular to the main surface of the element assembly 510.

To be more specific, in the case where a dimension of distance between the one main surface 10 of the element assembly 510 and an edge on the one main surface 10 of the inner electrode 130 is $L_5$, the dimension of distance $L_2$ along the thickness direction T of the element assembly 510 between the one main surface 10 of the element assembly 510 and the position of an end portion on the one main surface 10 of the insulation layer 123 satisfies a relation of $L_2<L_5$, at each end surface of the element assembly 510.

In the present preferred embodiment, $L_2>0$; that is, of the reinforcement layer 122 provided at each of the end surfaces of the element assembly 510, only a portion of the reinforcement layer 122 on the one main surface 10 is not covered by the insulation layer 123. In the case where the dimension of thickness of the element assembly 510 is $L_T$, it is preferable for the relation of $L_2>L_T/10$ to be satisfied. Accordingly, in the electronic component 500, it is preferable for both the relation of $L_2<L_5$ and the relation of $L_2>L_T/10$ to be satisfied. The electronic component 500 satisfies a relation of $L_T/10<L_2<L_5$ in the present preferred embodiment.

Further, the insulation layer 123 extends in the lengthwise direction L, which is a direction perpendicular or substantially perpendicular to the end surface of the element assembly 510, at each of the side surfaces of the element assembly 510. In the present preferred embodiment, the insulation layer 123 extends across the entirety of each side surface of the element assembly 510 along the lengthwise direction L of the element assembly 510. In other words, a portion of the insulation layer 123 is directly provided on the reinforcement layer 122 at each side surface of the element assembly 510. Another portion of the insulation layer 123 is directly provided on each side surface of the element assembly 510.

The insulation layer 123 provided at each end surface of the element assembly 510 and the insulation layer 123 provided at each side surface of the element assembly 510 are connected with each other so as to define a ring-shaped configuration. At each side surface of the element assembly 510, $L_2$ is the dimension of distance along the thickness direction T of the element assembly 510 between the one main surface 10 of the element assembly 510 and the position of the end portion on the one main surface 10 of the insulation layer 123.

Further, the insulation layer 123 covers the entirety of the other main surface 11 side of the element assembly 510. In other words, a portion of the insulation layer 123 is directly provided on the reinforcement layer 122 at the other main surface 11 side of the element assembly 510. Another portion of the insulation layer 123 is directly provided on the other main surface 11 of the element assembly 510. The insulation layer 123 covering the other main surface 11 side of the element assembly 510 is connected with the insulation layer 123 provided at each end surface of the element assembly 510 and the insulation layer 123 provided at each side surface of the element assembly 510, respectively.

As described above, portions of the insulation layer 123 are directly provided on the other main surface 11 of the element assembly 510 and the side surfaces of the element assembly 510. The insulation layer 123 has a higher adhesiveness with the element assembly 510 than that with the reinforcement layer 122. Therefore, providing a portion of the insulation layer 123 directly on the element assembly 510 makes it possible to significantly reduce or prevent the separation of the insulation layer 123 at the time of plating or mounting.

In the present preferred embodiment, the Sn-containing layer 124 extends from each end surface of the element assembly 510 to the one main surface 10. As described above, of the reinforcement layer 122 provided at each end surface of the element assembly 510, only a portion of the reinforcement layer 122 on the one main surface 10 is not covered by the insulation layer 123. Accordingly, at each end surface of the element assembly 510, the Sn-containing layer 124 covers the portion of the reinforcement layer 122 that is positioned on the one main surface 10 and is not covered by the insulation layer 123.

In addition, the Sn-containing layer 124 covers the reinforcement layer 122 that is not covered by the insulation layer 123 at the one main surface 10 of the element assembly 510. Furthermore, at each side surface of the element assembly 510, the Sn-containing layer 124 covers a portion of the reinforcement layer 122 that is positioned on the one main surface 10 and is not covered by the insulation layer 123.

As described above, the reinforcement layer 122 extends from the one end surface of the element assembly 510 onto both the main surfaces and the side surfaces thereof. Further, the reinforcement layer 122 extends from the other end surface of the element assembly 510 onto both the main surfaces and the side surfaces thereof.

As such, the Sn-containing layer 124 extends from the one end surface of the element assembly 510 to the one main surface 10 and to the side surfaces thereof. Further, the Sn-containing layer 124 extends from the other end surface of the element assembly 510 to the one main surface 10 and to the side surfaces thereof.

The Sn-containing layer 124 extending from the one end surface of the element assembly 510 to the one main surface 10 as well as to the side surfaces of the element assembly 510 and the Sn-containing layer 124 extending from the other end surface of the element assembly 510 to the one main surface 10 as well as to the side surfaces of the element assembly 510, are separated from each other and not electrically connected.

Also in the electronic component 500 according to the present preferred embodiment, the insulation layer 123 is provided at least at each end surface of the element assembly 510, thus making it possible to reduce the wetting of the solder fillet 30 and significantly reduce or prevent the generation of a crack in the element assembly 510 caused by tensile stress due to the thermal contraction of the solder fillet 30.

As described above, none of the inner electrodes 130 are located on the virtual plane $P_1$ that links the position of an edge of the insulation layer 123 at the end surface of the element assembly 510 on the one main surface 10 with the position of a tip of the outer electrode 120 on the one main surface 10 in a shortest distance. If a crack is generated by the tensile stress due to the thermal contraction of the solder fillet, the crack is likely to develop along the virtual surface $P_1$. Accordingly, because none of the inner electrodes 130 are located on the virtual plane $P_1$, cutting of the inner electrodes 130 due to the generation of a crack is significantly reduced or prevented. As a result, deterioration of electric characteristics of the electronic component 500 due to the generation of a crack is significantly reduced or prevented.

In addition, as described earlier, in the case where the dimension of distance between the one main surface 10 of the element assembly 510 and the edge portion on the one main surface 10 of the inner electrode 130 is $L_5$, $L_2$ is the dimension of distance along the thickness direction T of the element assembly 510 between the one main surface 10 of the element assembly 510 and the position of an end portion on the one main surface 10 of the insulation layer 123 at each end surface of the element assembly 510, and the dimension of thickness of the element assembly 510 is $L_T$, the relation of $L_T/10<L_2<L_5$ is satisfied.

Satisfying the relation of $L_T/10<L_2$ makes it possible to form an adequate solder fillet and ensure orientation stability of the electronic component 500 at the time of mounting. Further, falling-off of the electronic component 500 having been mounted from the substrate due to a shock or the like is significantly reduced or prevented.

It is preferable for the insulation layer 123 to cover the reinforcement layer 122 so as to be positioned as the outermost layer at each side surface of the element assembly 510. With this, in the case where the plurality of electronic components 500 are mounted close to each other, even if the electronic components 500 are mounted in a state in which the side surfaces of the adjacent electronic components 500 make contact with each other because of insufficient stability in orientation of the electronic components 500 and consequently the insulation layers 123 thereof are in contact with each other, it is possible to prevent the electronic components 500 that are in contact with each other from being electrically short-circuited.

By satisfying the relation of $L_2<L_5$, because the solder fillet is not overlapping with a functional region as a region where the inner electrodes 130 are stacked within the element assembly 510, the tensile stress produced by thermal contraction of the solder fillet can be made difficult to act on the functional region. As a result, it is possible to significantly reduce or prevent the generation of a crack due to the thermal contraction of the solder fillet.

The stacking directions of the inner electrodes 130 in the electronic component 100a according to the second preferred embodiment, the electronic component 100b according to the third preferred embodiment, and the electronic component 400 according to the fourth preferred embodiment may respectively be set to be the same as the stacking direction of the electronic components 500 in the present preferred embodiment.

It should be noted that the preferred embodiments disclosed in the present specification are merely examples and are not limiting in any way. The scope of the present invention is not indicated by the description made above, but by the appended claims, and further, meanings equivalent to the appended claims and any modification that is made within the range of the appended claims are intended to be included in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an element assembly in which inner electrodes are embedded and including a pair of main surfaces, a pair of side surfaces respectively connecting the main surfaces, and a pair of end surfaces respectively perpendicular or substantially perpendicular to the pair of main surfaces and the pair of side surfaces; and
   an outer electrode provided on a surface of the element assembly and electrically connected with the inner electrodes; wherein
   the outer electrode includes a sintered layer containing a sintered metal, a reinforcement layer that does not contain Sn but includes Cu or Ni, an insulation layer including an electric insulation material, and a Sn-containing layer including Sn;
   the sintered layer extends from each of the end surfaces onto at least one of the main surfaces so as to cover each of the end surfaces;
   the reinforcement layer covers an entirety of the sintered layer;
   the insulation layer is directly provided on the reinforcement layer at each of the end surfaces so as to extend in a direction perpendicular or substantially perpendicular to the side surfaces and defines a portion of a surface of the outer electrode; and
   the Sn-containing layer covers the reinforcement layer except for a portion of the reinforcement layer that is covered by the insulation layer and defines another portion of the surface of the outer electrode.

2. The electronic component according to claim 1, wherein the Sn-containing layer extends from each of the end surfaces to one of the main surfaces.

3. The electronic component according to claim 2, wherein none of the inner electrodes are located in a virtual plane that links a position of an edge of the insulation layer at an end surface on one of the main surfaces with a position of a tip of the outer electrode on one of the main surfaces in a shortest distance.

4. The electronic component according to claim 2, wherein the insulation layer is provided on the reinforcement layer at each of the end surfaces so that at least a portion of the insulation layer is located between one of the main surfaces and a position of an edge portion of the inner electrode closest to one of the main surfaces in a direction perpendicular or substantially perpendicular to the main surface.

5. The electronic component according to claim 1, wherein
   the sintered layer extends from each of the end surfaces onto each of the side surfaces; and
   the insulation layer is provided on the reinforcement layer at each of the side surfaces so as to extend in a direction perpendicular or substantially perpendicular to the end surface.

6. The electronic component according to claim 1, wherein
   the outer electrode further includes a base layer which is made of a material different from a material of the reinforcement layer and contains Cu or Ni; and
   the base layer is provided between the sintered layer and the reinforcement layer so as to cover the entirety of the sintered layer.

7. The electronic component according to claim 1, wherein
   the outer electrode further includes a shield layer which is made of a material different from a material of the reinforcement layer and contains Cu or Ni; and
   the shield layer is provided between the reinforcement layer and the Sn-containing layer.

8. The electronic component according to claim 1, wherein the electronic component is one of a ceramic capacitor, a piezoelectric component, a thermistor, and an inductor.

* * * * *